United States Patent
Silverbrook

(10) Patent No.: US 6,264,849 B1
(45) Date of Patent: *Jul. 24, 2001

(54) METHOD OF MANUFACTURE OF A BEND ACTUATOR DIRECT INK SUPPLY INK JET PRINTER

(75) Inventor: Kia Silverbrook, Sydney (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/112,769

(22) Filed: Jul. 10, 1998

(30) Foreign Application Priority Data

Jul. 15, 1997 (AU) .................................... PO7991
Sep. 23, 1997 (AU) .................................... PO9390

(51) Int. Cl.$^7$ ........................................... B41J 2/16
(52) U.S. Cl. .............................................. 216/27
(58) Field of Search ............................. 216/27; 438/21; 347/54, 59

(56) References Cited

U.S. PATENT DOCUMENTS

| | | | |
|---|---|---|---|
| 4,654,676 | * | 3/1987 | Itano et al. ...................... 346/140 R |
| 5,262,000 | * | 11/1993 | Welbourn et al. .................. 156/643 |
| 5,322,594 | * | 6/1994 | Bol .......................................... 216/27 |
| 5,684,519 | * | 11/1997 | Matoba et al. ....................... 347/54 |
| 5,719,604 | * | 2/1998 | Inui et al. ............................. 347/54 |
| 5,804,083 | * | 9/1998 | Ishii et al. ............................... 216/2 |
| 5,812,159 | * | 9/1998 | Anagnostopoulos et al. ......... 347/55 |
| 5,825,383 | * | 10/1998 | Abe ....................................... 347/54 |
| 5,872,582 | * | 2/1999 | Pan ....................................... 347/65 |
| 5,877,791 | * | 3/1999 | Lee et al. .............................. 347/63 |
| 5,897,789 | * | 4/1999 | Weber ................................... 216/27 |
| 5,912,684 | * | 6/1999 | Fujii et al. ............................ 347/54 |

* cited by examiner

Primary Examiner—Anita Alanko

(57) ABSTRACT

A method of manufacture of a thermally actuated ink jet printer which ejects ink via the utilization of a thermal actuator device is disclosed comprising the steps of initially providing a silicon and circuitry wafer layer including electrical circuitry necessary for the operation of the thermal actuators on demand; depositing a first sacrificial layer on top of the silicon and circuitry wafer layer; forming a series of heater structure layers comprising the thermal actuator on top of the first sacrificial layer; depositing a second sacrificial layer on top of the heater structure layers, the second sacrificial layer including suitably etched portions for the forming of a nozzle chamber; depositing a nozzle chamber layer forming a nozzle chamber of the ink jet printer having an ink ejection port defined therein on top of the second sacrificial layer; back etching the silicon wafer layer to form an ink supply channel in a region underneath a moveable end of the thermal actuator; and etching the first and second sacrificial layer in addition to relevant portions of the circuitry layer, if any, so as to release the thermal actuator layers to provide for an operational ink jet printer nozzle supplied via the ink supply channel.

14 Claims, 14 Drawing Sheets

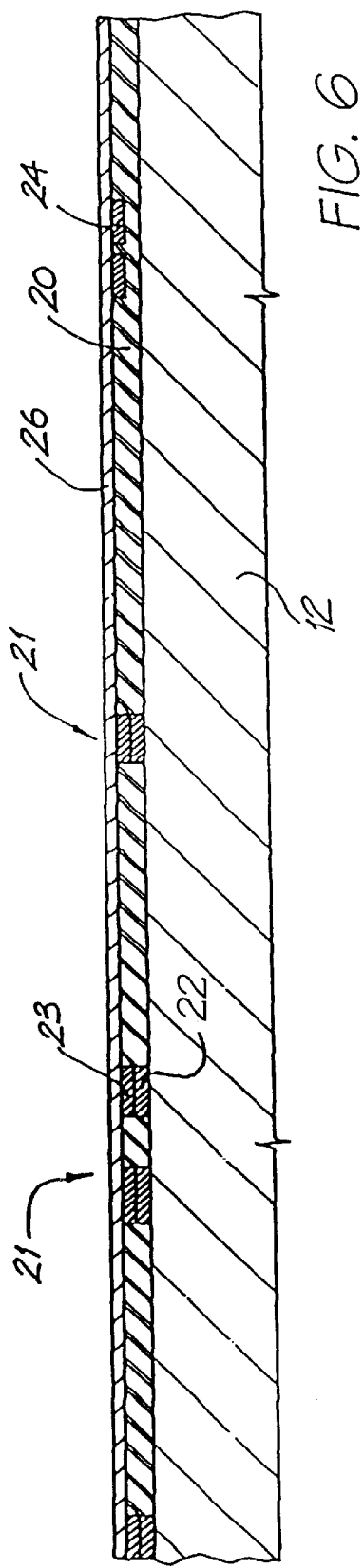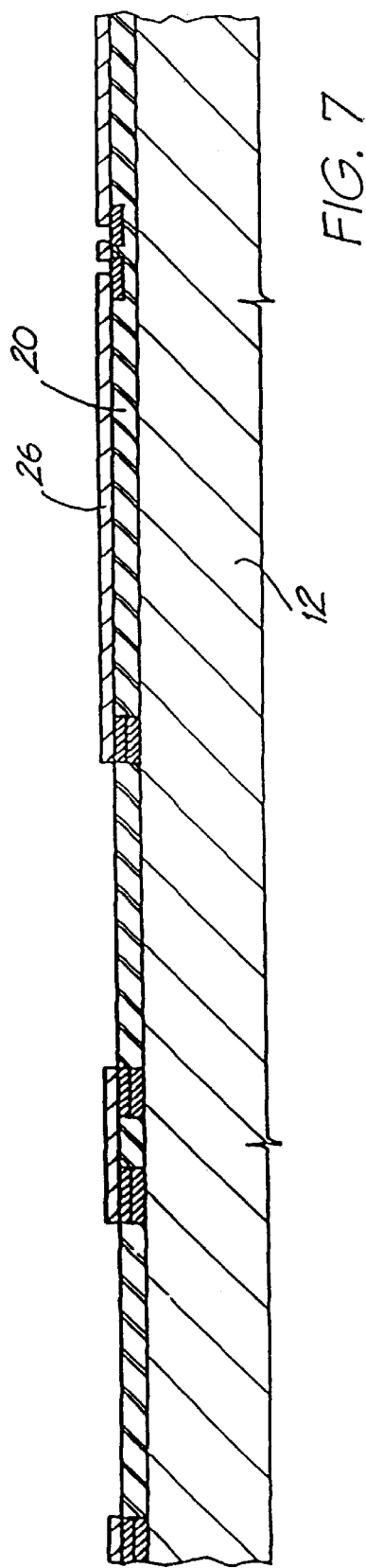

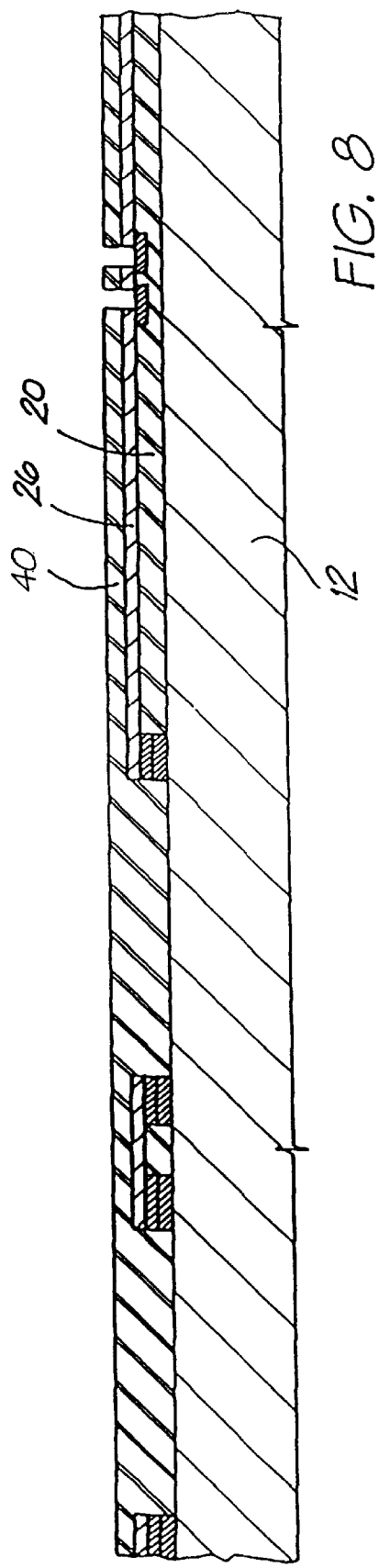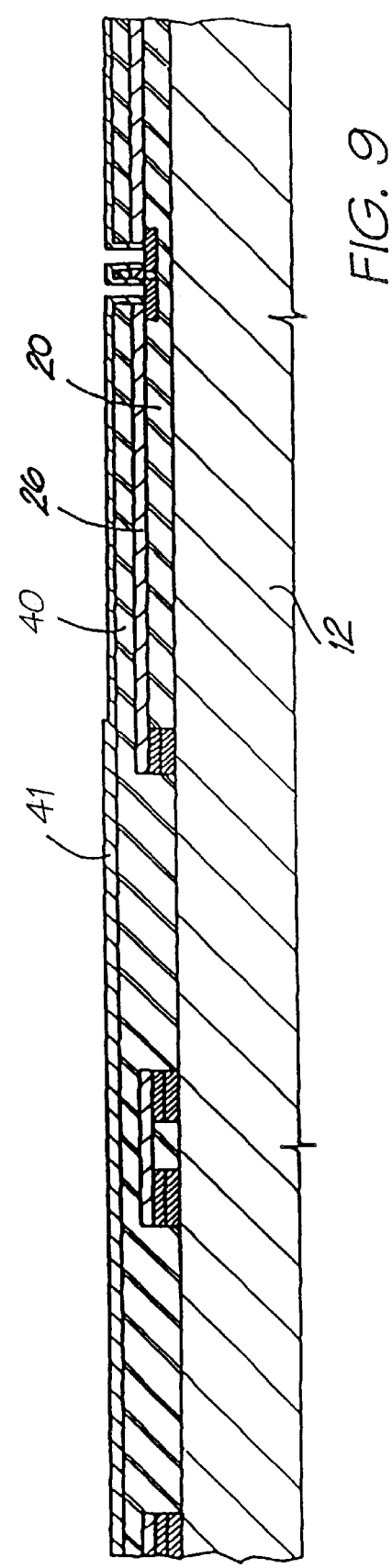

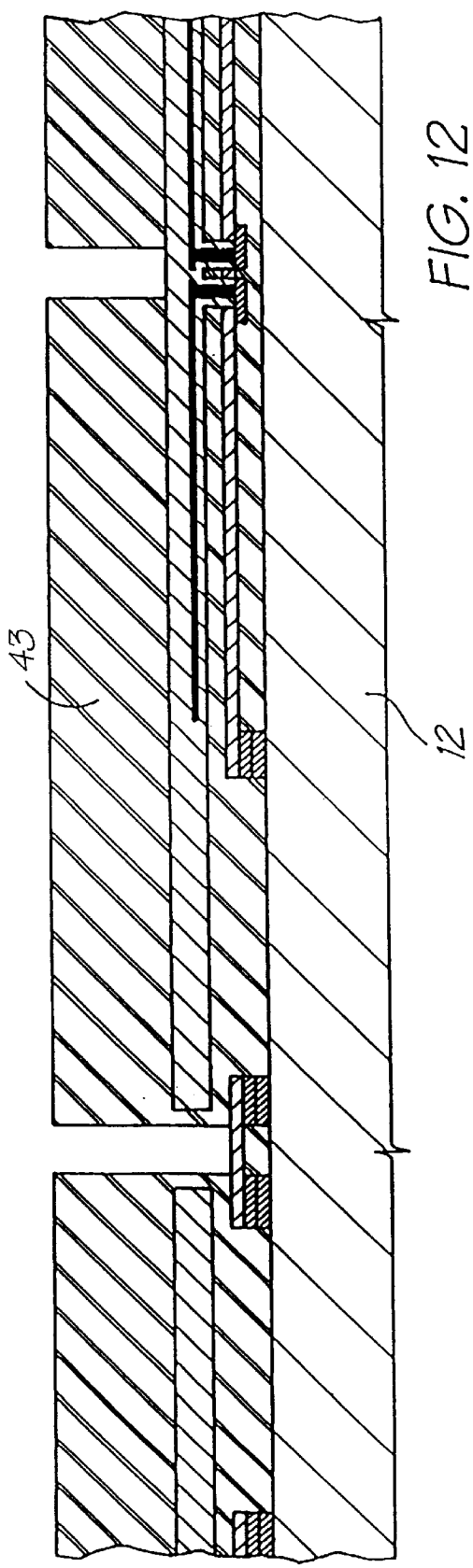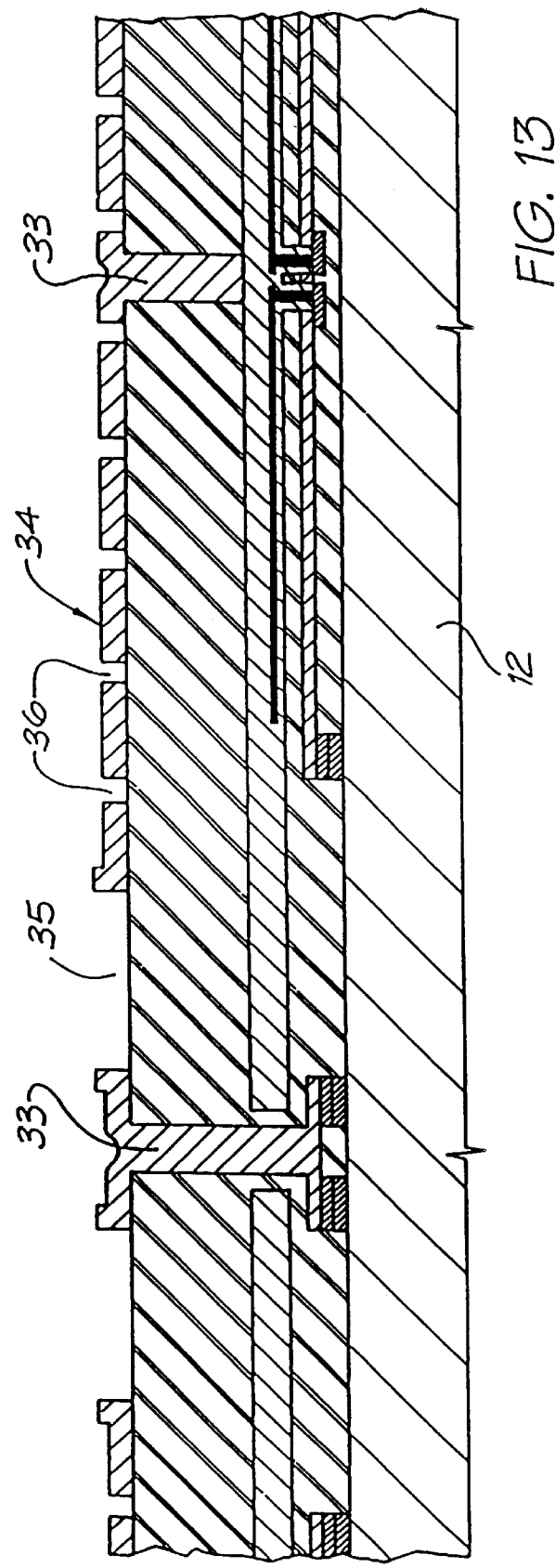

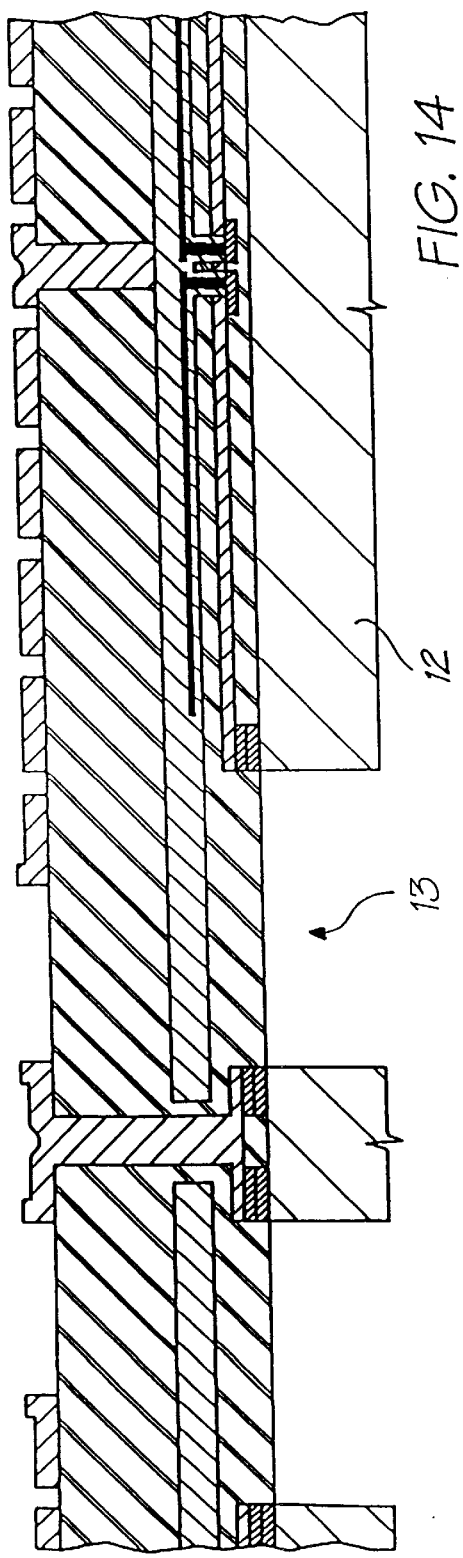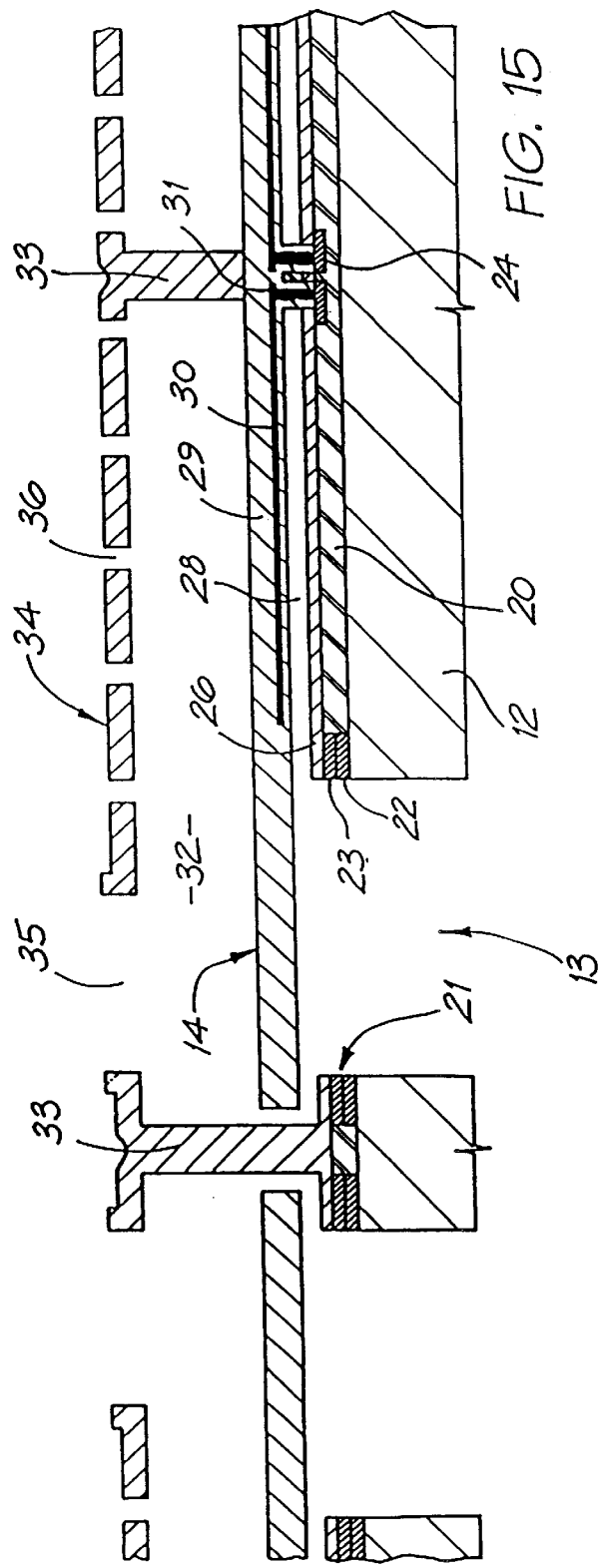

METHOD OF MANUFACTURE OF A BEND ACTUATOR DIRECT INK SUPPLY INK JET PRINTER

CROSS REFERENCES TO RELATED APPLICATIONS

The following Australian provisional patent applications are hereby incorporated by cross-reference. For the purposes of location and identification, U.S. patent applications identified by their U.S. patent application serial numbers (USSN) are listed alongside the Australian applications from which the U.S. patent applications claim the right of priority.

| CROSS-REFERENCED AUSTRALIAN PROVISIONAL PATENT APPLICATION NO. | U.S. PAT. NO./PATENT APPLICATION (CLAIMING RIGHT OF PRIORITY FROM AUSTRALIAN PROVISIONAL APPLICATION) | DOCKET NO. |
| --- | --- | --- |
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797, 6,137,500 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | O9/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811, 6,188,415 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126, 6,190,931 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |

-continued

| CROSS-REFERENCED AUSTRALIAN PROVISIONAL PATENT APPLICATION NO. | U.S. PAT. NO./PATENT APPLICATION (CLAIMING RIGHT OF PRIORITY FROM AUSTRALIAN PROVISIONAL APPLICATION) | DOCKET NO. |
|---|---|---|
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 6,110,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832, 6,180,427 | IJM41 |
| PP3990 | 09/112,831, 6,171,875 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 6,152,619 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to the manufacture of ink jet print heads and, in particular, discloses a method of manufacture of a bend Actuator Direct Ink Supply Ink Jet Printer.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

Of course, with any ink jet design, it is important to provide a construction arrangement as compact as possible.

SUMMARY OF THE INVENTION

It is an object of the present invention to provide for the manufacture of an efficient compact form of ink jet printer device.

In accordance with the first aspect of the present invention there is provided a method of manufacture of a thermally actuated ink jet printer which ejects ink via the utilization of a thermal actuator device comprising the steps of initially providing a silicon and circuitry wafer layer including electrical circuitry necessary for the operation of the thermal actuators on demand; depositing a first sacrificial layer on top of the silicon and circuitry wafer layer; forming a series of heater structure layers comprising the thermal actuator on top of the first sacrificial layer; depositing a second sacrificial layer on top of the heater structure layers, the second sacrificial layer including suitably etched portions for the forming of a nozzle chamber; depositing a nozzle chamber layer forming a nozzle chamber of the ink jet printer having an ink ejection port defined therein on top of the second sacrificial layer; back etching the silicon wafer layer to form an ink supply channel in a region underneath a moveable end of the thermal actuator; and etching the first and second sacrificial layer in addition to relevant portions of the circuitry layer, if any, so as to release the thermal actuator layers to provide for an operational ink jet printer nozzle supplied via the ink supply channel.

Preferably, multiple ink jet nozzles are formed on a single wafer and wherein the back etching includes forming a single ink supply channel supplying multiple different nozzle chambers. Each of the ink supply channels abuts a nitride wall of the nozzle chamber the nitride wall dividing the ink supply channel into multiple supply channels.

The heater structure layers can be formed by the steps of depositing a first expansive material layer on top of the first sacrificial layer; depositing a conductive heater layer on to of the first expansive material layer; and depositing a second expansive material layer on top of the conductive heater layer. The conductive heater layer can be formed from gold utilizing chemical mechanical planarization.

The circuitry layer can preferably include metal conductive lines which are utilized to from a barrier to protect other portions of the circuitry layer from unwarranted etching by any sacrificial etchant utilized in etching of the sacrificial layer.

The nozzle chamber layer can ideally include a series of small etchant holes utilized in the etching of the sacrificial layers and can comprise substantially Silicon Nitride. The nozzle chamber layer can include portions formed directly on the heater structure layers which act to firmly clamp the heater structure layers to lower layers.

In accordance with a further aspect of the present invention, there is provided a method of manufacturing a bend actuator direct ink supply print head wherein an array of nozzles are formed on a substrate utilising planar monolithic deposition, lithographic and etching processes.

Multiple ink jet heads are preferably formed simultaneously on a single silicon wafer planar substrate.

The print heads are preferably formed utilising standard vlsi/ulsi processing with the integrated drive electronics preferably formed on the same substrate. The integrated drive electronics may be formed utilising a CMOS fabrication process.

Ink can be ejected from the substrate substantially normal to the substrate.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIGS. 6–15 are cross-sectional views illustrating various steps in the construction of the preferred embodiment.

DESCRIPTION OF PREFERRED AND OTHER EMBODIMENTS

In the preferred embodiment, a drop on demand ink jet printer is provided which allows for the ejection of ink on demand by means of a thermal actuator which operates to eject the ink from a nozzle chamber. The nozzle chamber is formed directly over an ink supply channel thereby allowing for an extremely compact form of nozzle chamber. The extremely compact form of nozzle chamber allows for minimal area to be taken up by the printer head device thereby resulting in an improved economics fabrication.

Figure 1:
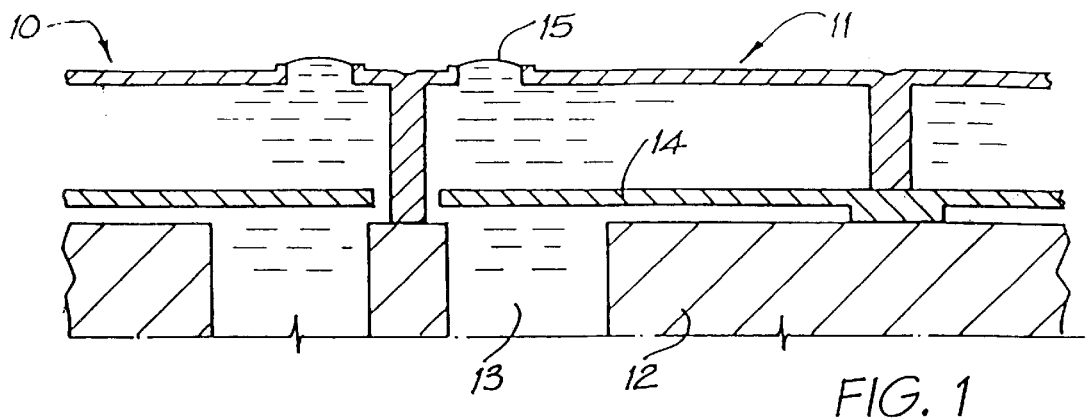
FIGS. 1–3 illustrate basic operation of the preferred embodiments.
Figure 2:
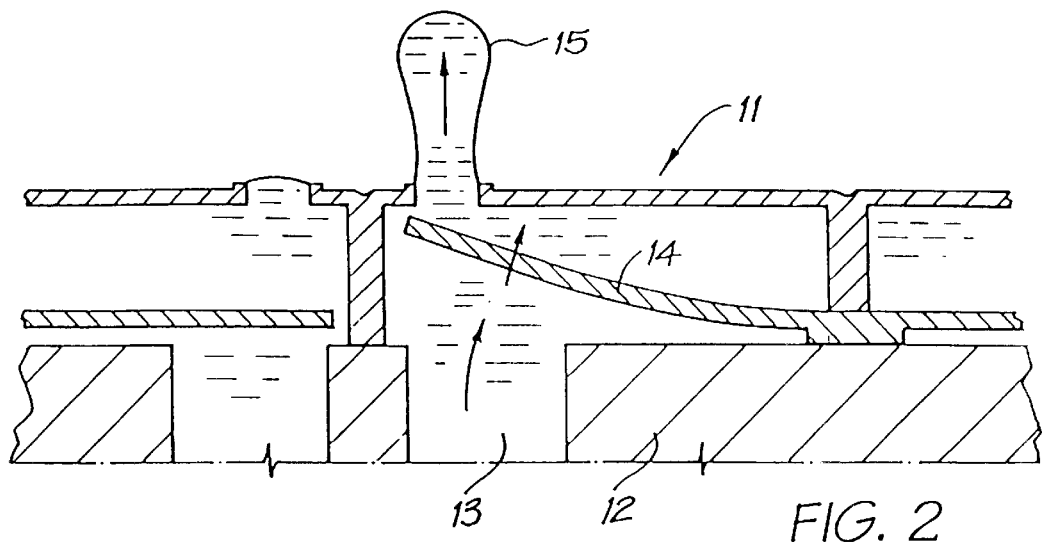
Figure 3:
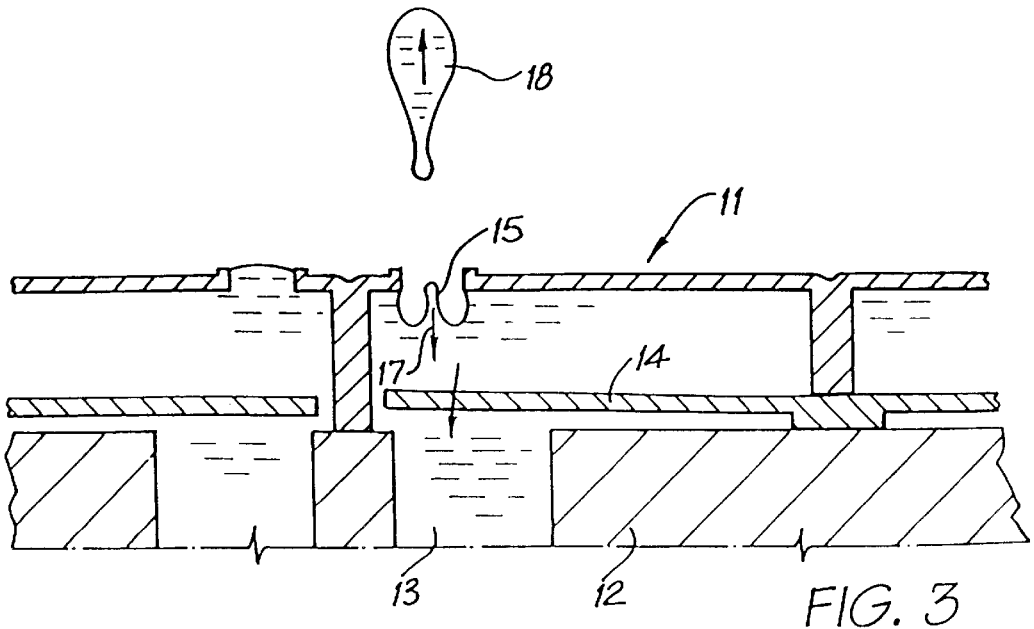

Turning initially to FIGS. 1–3, the operation of the preferred embodiments is described. In FIG. 1, there is illustrated a sectional view of two ink jet nozzles 10, 11 which are formed on a silicon wafer eg. 12 which includes a series of through wafer ink supply channels eg. 13.

Located over a portion of the wafer 12 and over the ink supply channel 13 is a nozzle actuator device 14 which is actuated so as to eject ink from the corresponding nozzle chamber eg. 11. The actuator 14 is placed substantially over the ink supply channel 13. In the quiescent position, the ink fills the nozzle chamber 11 and an ink meniscus 15 forms across the output nozzle of the chamber 11.

When it is desired to eject a drop from the chamber 11, the thermal actuator 14 is activated by means of passing a current through the actuator. The actuation causes the actuator 14 to rapidly bend upwards as indicated in FIG. 2. The movement of the actuator 14 results in an increase in the ink pressure around the nozzle of the chamber 11 which in turn causes a significant bulging of the meniscus 15 and the flow of ink out of the nozzle chamber 11. The actuator 14 can be constructed so as to impart sufficient momentum to the ink to cause the direct ejection of a drop. Alternatively, as indicated in FIG. 3, the activation of actuator 14 can be timed so as to turn the actuation current off at a predetermined point so as to cause the return of the actuator 14 to its original position thereby resulting in a consequential backflow of ink 17 into the chamber 11 thereby causing a necking and separation of a body of ink 18 which has a continuing momentum and continues towards the output media, such as paper, for printing thereof. Subsequently, the actuator 14 returns to its quiescent position and surface tension effects result in a refilling of the nozzle chamber 11 via ink supply channel 13 as a consequence of surface tension effects on the meniscus 15. In time, the arrangement returns to that depicted in FIG. 1.

Figure 4:
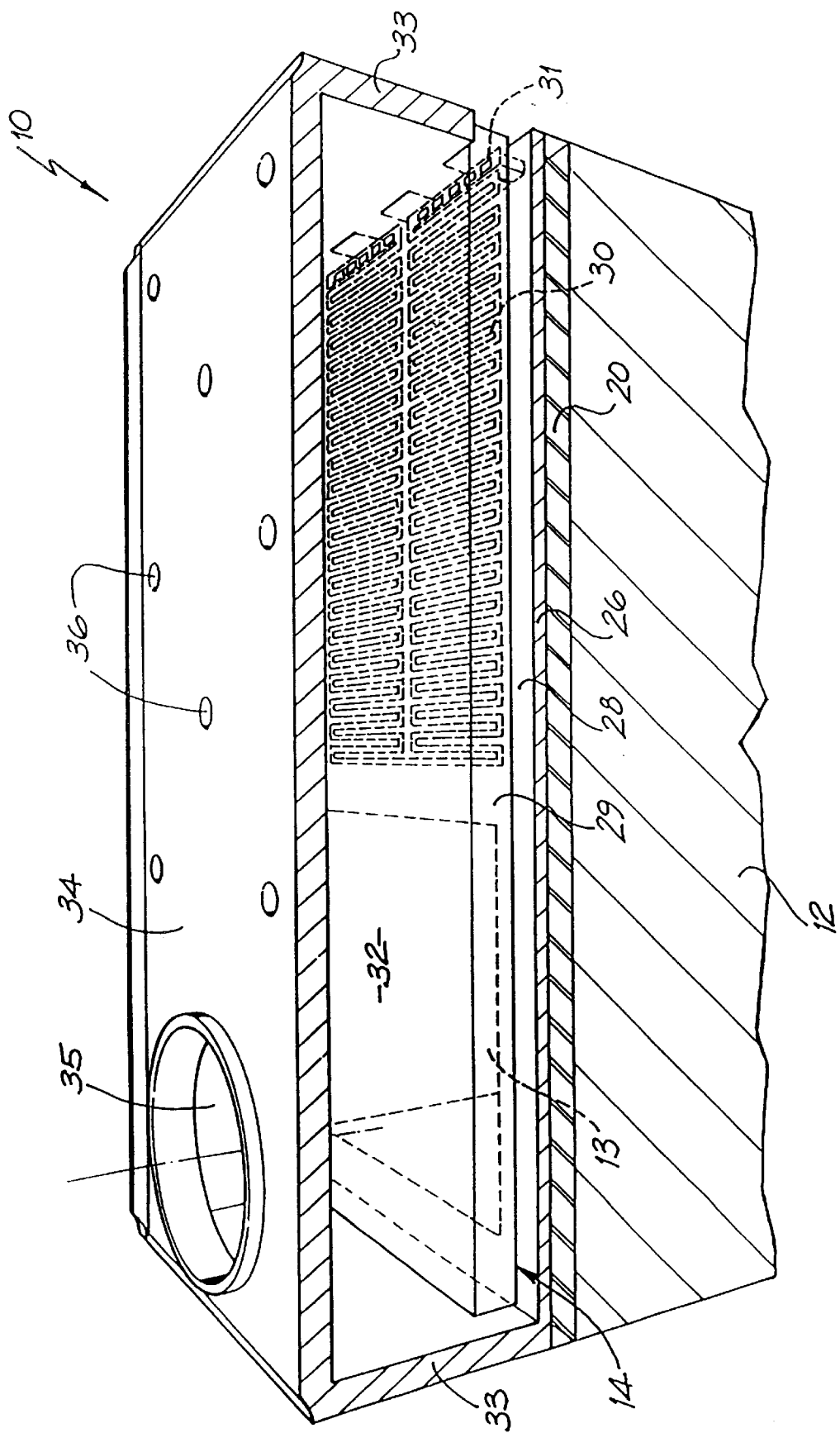
FIG. 4 is a sectional view of the preferred embodiment.
Figure 5:
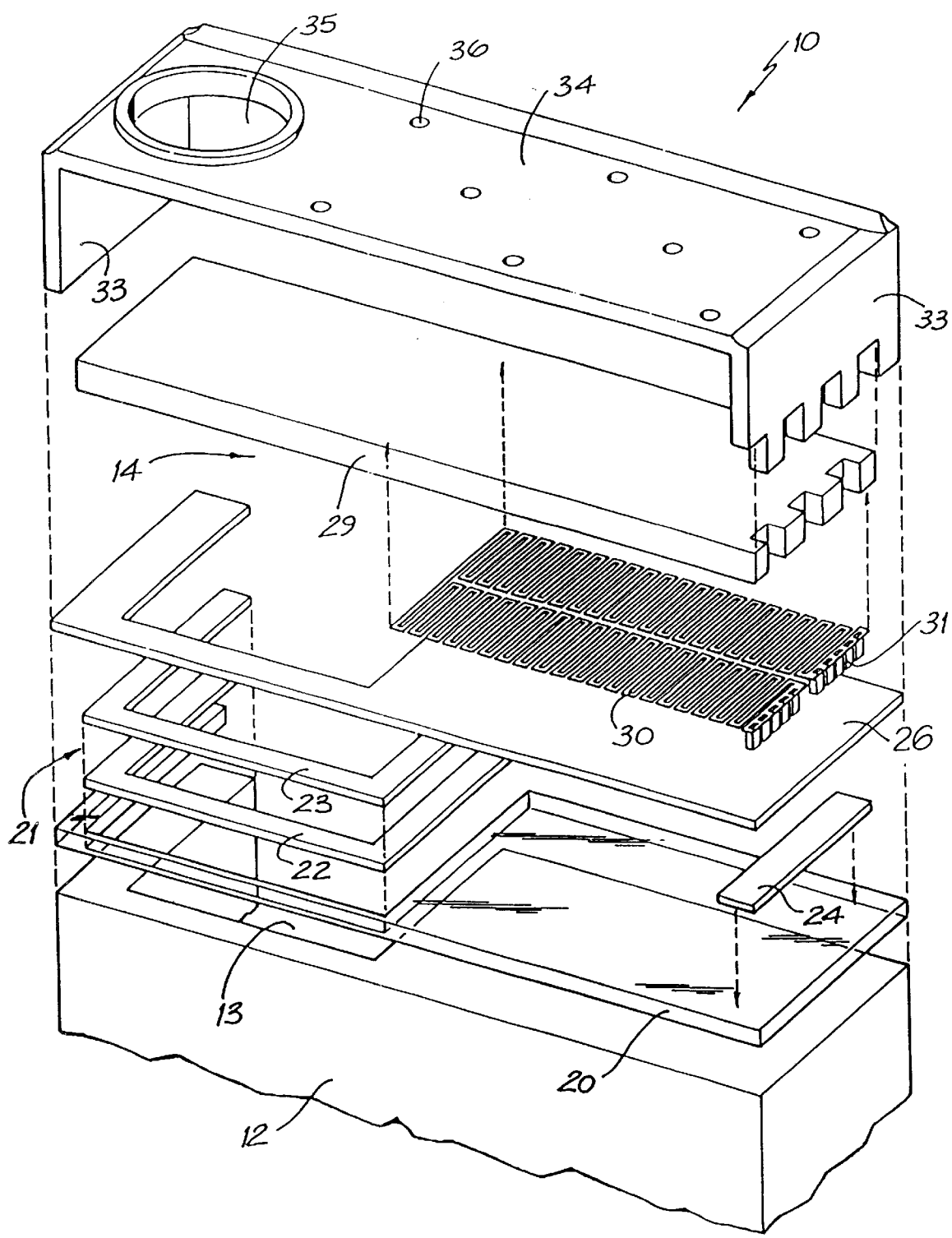
FIG. 5 is an exploded perspective view of the preferred embodiment.

Turning now to FIGS. 4 and 5, there is illustrated the structure of a single nozzle chamber 10 in more detail. FIG. 4 illustrates partly in section with FIG. 5 showing a corresponding exploded perspective. Ink jet nozzles can be formed, many print heads at a time, on a selected wafer base 12 utilising standard semiconductor processing techniques in addition to micro machining and micro fabrication process technology and a full familiarity with these technologies is hereinafter assumed.

On top of the silicon wafer layer 12 is formed a CMOS layer 20. The CMOS layer 20 can, in accordance with standard techniques, include multi-level metal layers sandwiched between oxide layers and preferably at least a two level metal process is utilised. In order to reduce the number of necessary processing steps, the masks utilised include areas which provide for a build up of an aluminum barrier 21 which can be constructed from a first 22 and second 23 level aluminum layer. Additionally, aluminum portions eg. 24 are provided for providing electrical contacts to a subsequent heater layer. The aluminum barrier portion 21 is important in providing an effective barrier to the possible subsequent etching of the oxide within the CMOS layer 20 when a sacrificial etchant is utilised in the construction of a nozzle chamber 10 with the etchable material preferably being glass layers.

On top of the CMOS layer 20 is formed a nitride passivation layer 26 which is formed to protect the lower CMOS layers from sacrificial etchants and ink erosion. Above the nitride layer 26 there is formed a gap 28 in which an air bubble forms during operation. The gap 28 can be constructed by a means of laying down a sacrificial layer and subsequently etching the gap as will be explained hereinafter.

On top of the air gap 28 is constructed a polytetrafluoroethylene (PTFE) heater layer 29 which really comprises two PTFE layers that sandwich a gold serpentine heater layer 30. The gold heater 30 is constructed in a serpentine form to allow it to expand on heating. The heater layer 30 and PTFE layer 29 together comprise the thermal actuator 14 of FIG. 1.

The outer PTFE layer 29 has an extremely high coefficient of thermal expansion (approximately $770 \times 10^{-6}$, or around 380 times that of silicon). The PTFE layer 29 is also normally highly hydrophobic which results in an air bubble being formed under the actuator in the region 28 due to out-gassing etc. The top PTFE surface layer is treated so as to make it hydrophilic in addition to those areas around ink supply channel 13. This can be achieved with a plasma etch in an ammonia atmosphere. The heater layer 30 is also formed within the lower portion of the PTFE layer.

The heater layer 30 is connected at ends eg. 31 to the lower CMOS drive layer 20 which contains the drive circuitry (not shown). For the purposes of actuation, a current is passed through the gold heater element 30 which heats the bottom surface of the actuator 14. The bottom surface of the actuator 14, in contact with air bubble 28, remains heated while any top surface heating is carried away by the exposure of the top surface of the actuator 14 to the ink within the chamber 32. Hence, the bottom PTFE layer expands more rapidly resulting in a general rapid bending upwards of actuator 14 (as illustrated in FIG. 2) which consequentially causes the ejection of ink from ink ejection port 35.

The actuator 14 can be deactivated by turning off the current to the heater element 30. This results in a return of the actuator 14 to its rest position.

A nozzle plate comprising side wall portions 33 and top portion 34 is formed on top of the actuator. The nozzle plate can be formed via a dual damascene process utilising a sacrificial layer. The top portion 34 is etched to have nozzle ink ejection hole 35 in addition to a series of etchant holes eg. 36 which are of a relatively small diameter and allow for effective etching of lower sacrificial layers when utilising a sacrificial etchant. The etchant holes 36 are made small enough such that surface tension effects restrict the possibilities of ink being ejected from the chamber 32 via the etchant holes 36 rather than the nozzle hole 35.

Figure 10:
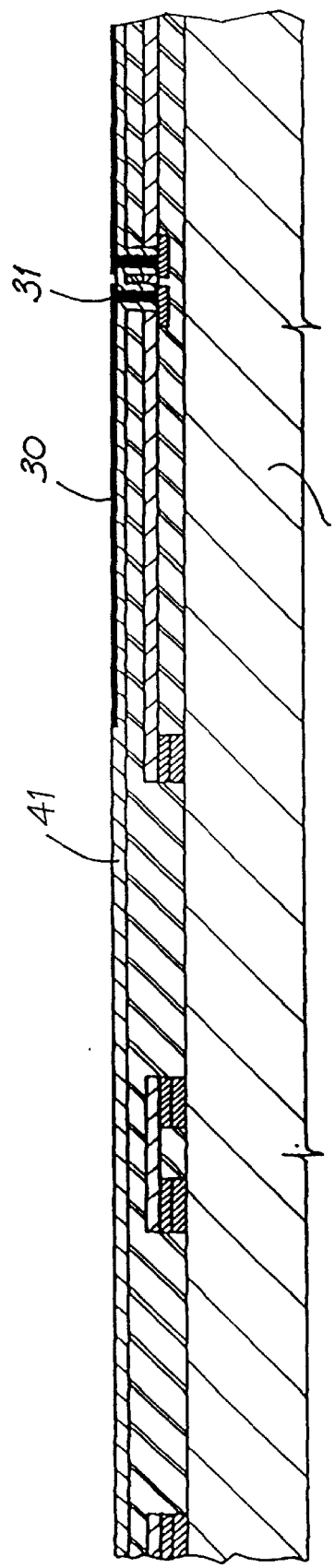
Figure 11:
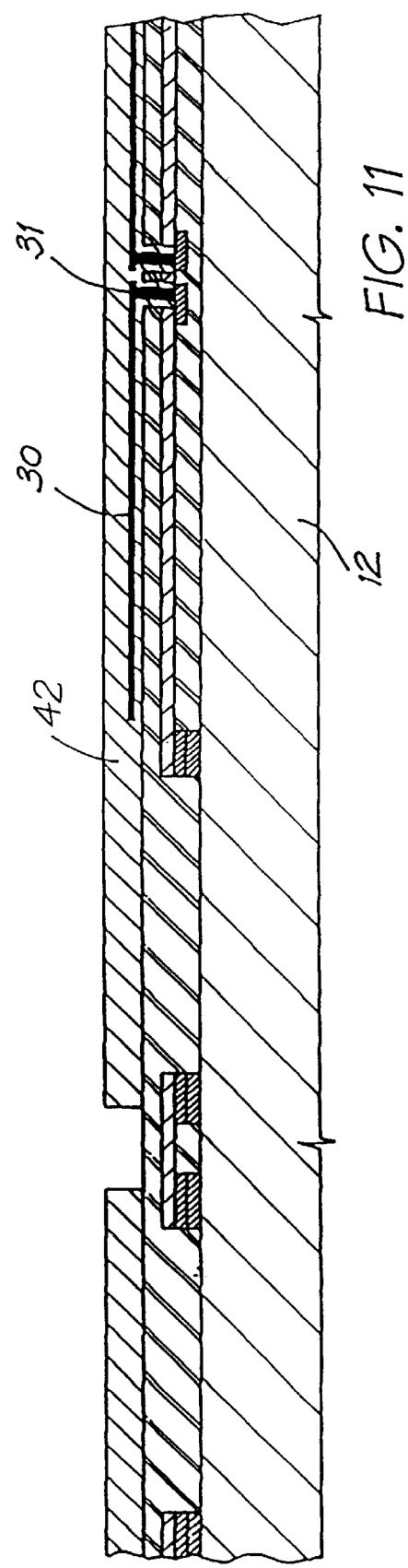

Turning now to FIGS. 6–15, there are set out the various steps involved in the construction of an array of ink jet nozzles:

1. Turning initially to FIG. 6, the starting position comprises a silicon wafer 12 including a CMOS layer 20 which is passivated by the nitride layer 26 and surface finished with a chemical-mechanical planarisation process.
2. The nitride layer 26 is masked and etched as illustrated in FIG. 7 so as to define portions of the nozzle chamber 32 and areas for interconnection between any subsequent heater layer and a lower CMOS layer.
3. Next, a sacrificial oxide layer 40 is deposited, masked and etched as indicated in FIG. 8 with the oxide layer being etched in those areas where a subsequent heater layer electronically contacts the lower layers.
4. As illustrated in FIG. 9, next a 1 micron thick layer of PTFE 41 is then deposited and firstly masked and etched for the heater contacts to the lower CMOS layer and secondly masked and etched for the heater shape.
5. Next, as illustrated in FIG. 10, the gold heater layer 30, 31 is deposited. Due to the fact that it is difficult to etch gold, the layer can be conformally deposited and portions of the layer subsequently removed utilising chemical mechanical planarisation so as to leave those portions associated with the heater element. The processing steps 4 and 5 basically generate a dual damascene.
6. Next, a top PTFE layer 42 is deposited and masked and etched down to the sacrificial layer as illustrated in FIG. 11 so as to define the heater shape. Subsequently, the surface of the PTFE layer 42 is plasma processed so as to make it hydrophilic. Suitable processing can including plasma damage in an ammonia atmosphere. Alternatively, the surface can be coated with a hydrophilic material.
7. A further sacrificial oxide layer 43 is then deposited and etched as illustrated in FIG. 12 so as to form a structure for a nozzle chamber 32. The sacrificial layer 43 is masked and etched in order to define the nozzle chamber walls.
8. Next, as illustrated in FIG. 13, the nozzle chamber is formed by conformally depositing three microns of nitride to form the nitride nozzle plate. A mask nozzle rim is etched to a depth of one micron for the nozzle rim (the etched depth not being overly time critical). Subsequently, a mask is utilised to etch the nozzle holes 35 in addition to the sacrificial layer etchant holes 36.
9. Next, as illustrated in FIG. 14, a back of the wafer is masked for the ink channels 13 and plasma etched through the wafer. A suitable plasma etching process can include a deep anisotropic trench etching system such as that available from SDS Systems Limited (See) "Advanced Silicon Etching Using High Density Plasmas" by J. K. Bhardwaj, H. Ashraf, page 224 of Volume 2639 of the SPIE Proceedings in Micro Machining and Micro Fabrication Process Technology).
10. Next, as illustrated in FIG. 15, the sacrificial layers are etched away utilising a sacrificial etchant such as hydrofluoric acid. Subsequently, the portion underneath the actuator which is around the ink channel is plasma processed through the back of the wafer to make that position hydrophilic.

Figure 16:
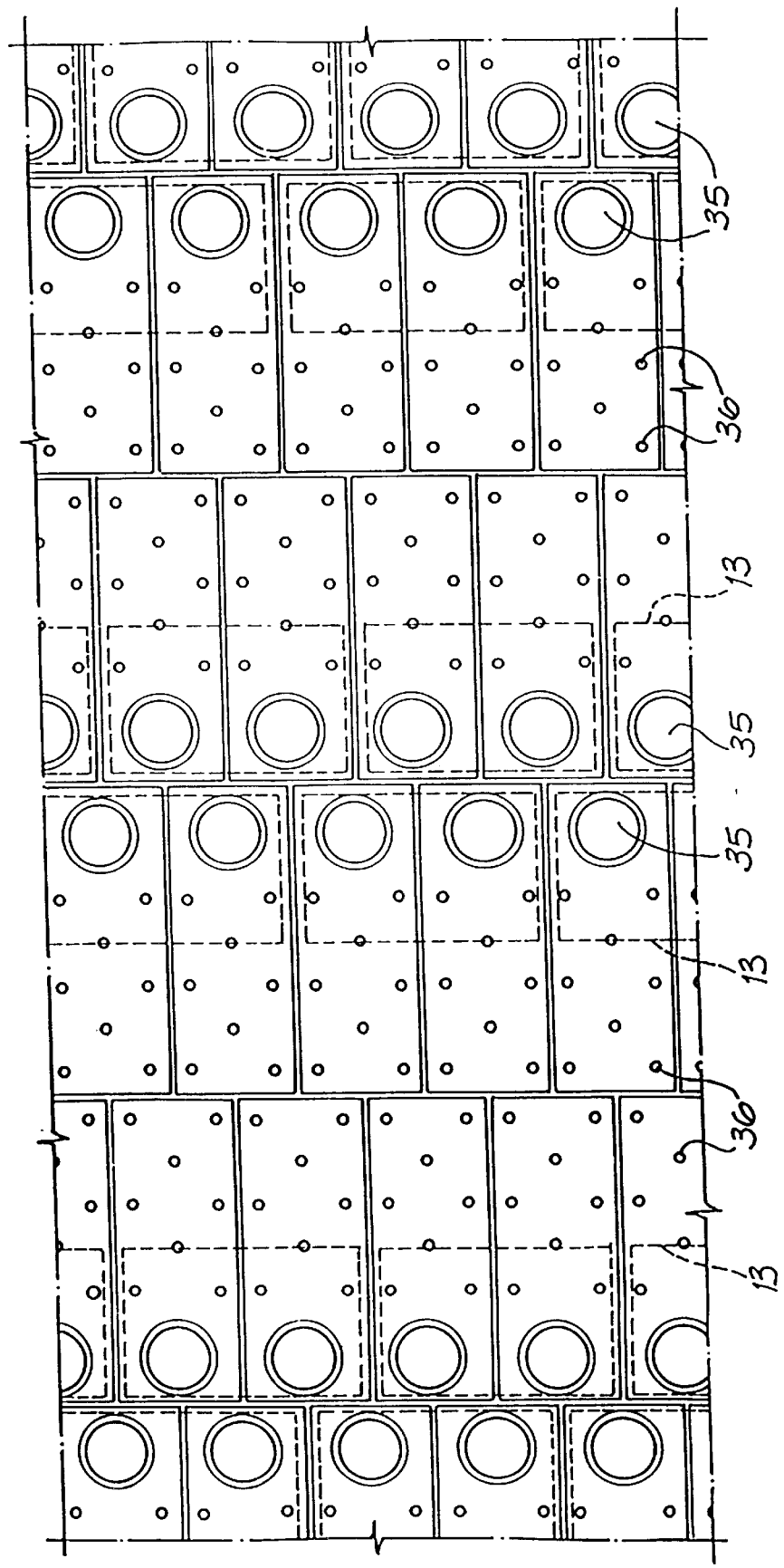
FIG. 16 illustrates a top view of an array of ink jet nozzles constructed in accordance with the principles of the present invention.

Subsequently, the wafer contains a number of the ink jet printer heads that can be separated into separate print head chips with each print head chip bonded into an injection molded ink supply channel. The electrical signals to the chips can be tape automated bonded (TAB) to the print head for subsequent testing. FIG. 16 illustrates a top view of jet nozzles constructed on a wafer so as to provide for page width multicolor output.

Figure 17:
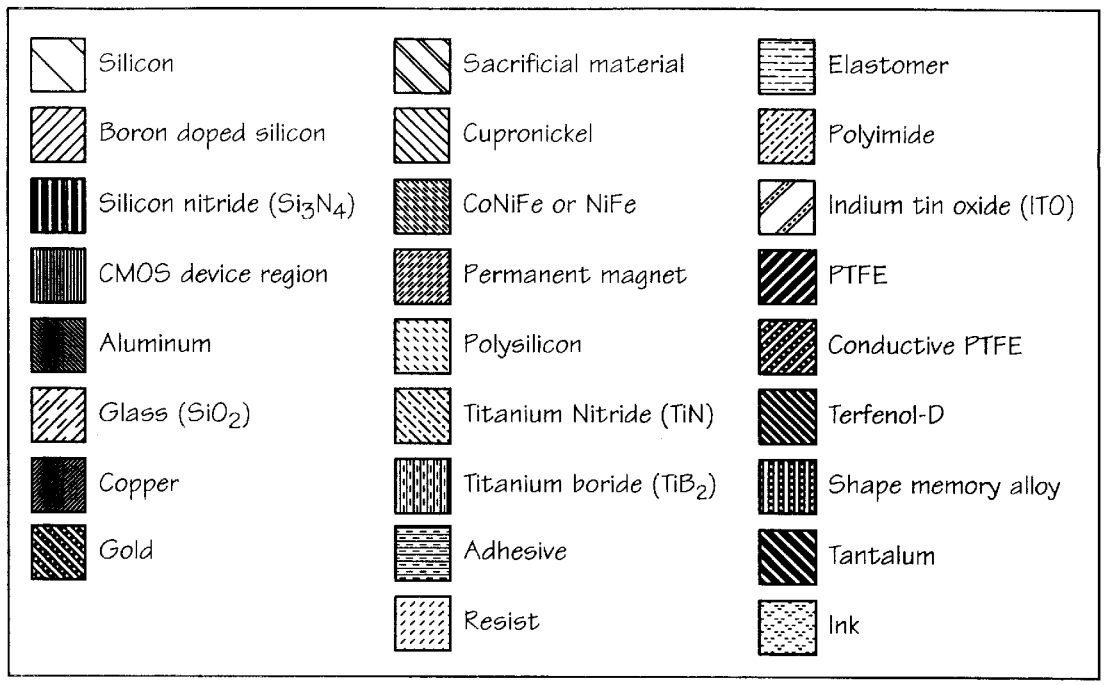
FIG. 17 provides a legend of the materials indicated in FIGS. 18 to 29.
Figure 18:
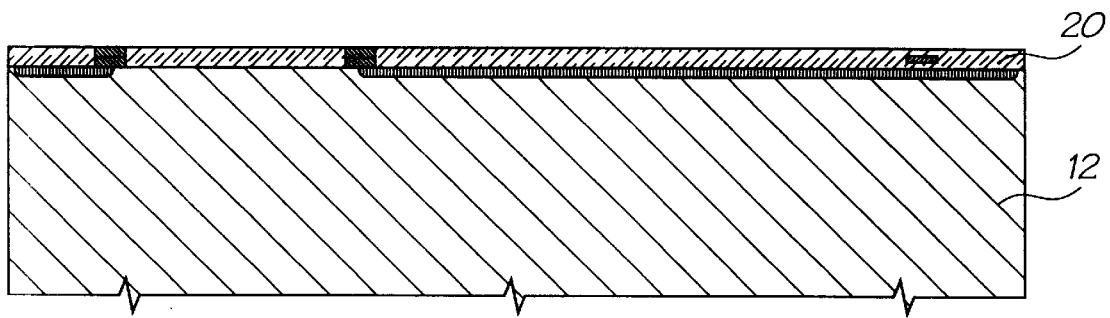
FIG. 18 to FIG. 29 illustrate sectional views of the manufacturing steps in one form of construction of an ink jet printhead nozzle.
Figure 19:
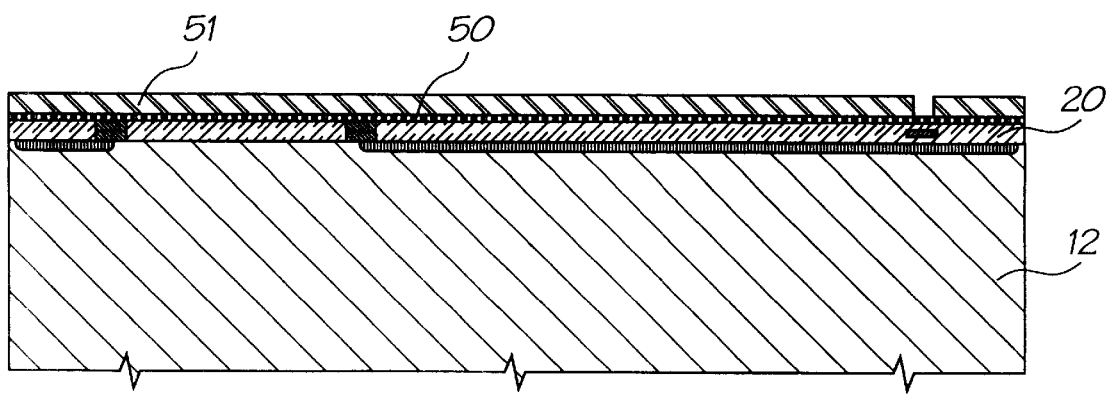
Figure 20:
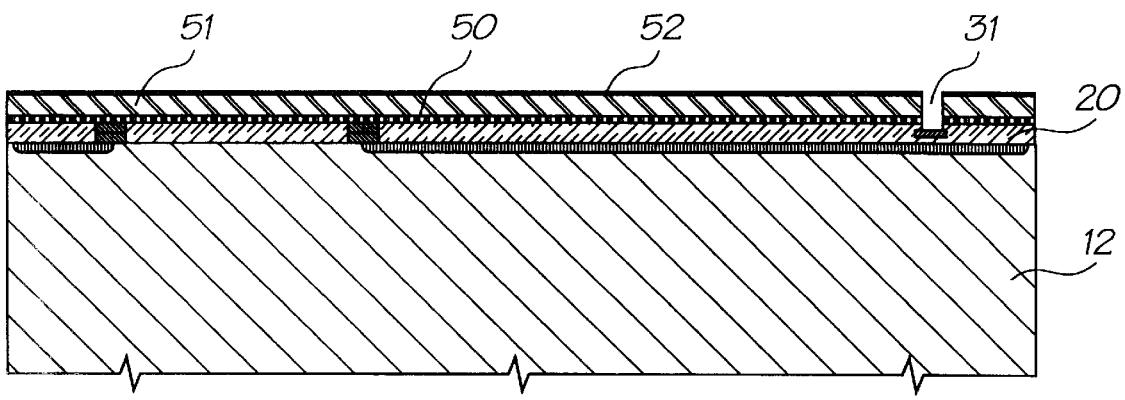

One form of detailed manufacturing process which can be used to fabricate monolithic ink jet print heads operating in accordance with the principles taught by the present embodiment can proceed utilizing the following steps:

1. Using a double sided polished wafer 12, provide complete drive transistors, data distribution, and timing circuits using a 0.5 micron, one poly, 2 metal CMOS processor 20. This step is shown in FIG. 18. For clarity, these diagrams may not be to scale, and may not represent a cross section though any single plane of the nozzle. FIG. 17 is a key to representations of various materials in these manufacturing diagrams, and those of other cross referenced ink jet configurations.
2. Deposit 1 micron of low stress nitride 50. This acts as a barrier to prevent ink diffusion through the silicon dioxide of the chip surface.
3. Deposit 3 micron of sacrificial material 51 (e.g. polyimide).
4. Etch the sacrificial layer using 51 Mask 1. This mask defines the actuator anchor point. This step is shown in FIG. 19.
5. Deposit 0.5 microns of PTFE 52.
6. Etch the PTFE, nitride, and CMOS passivation down to second level metal using Mask 2. This mask defines the heater vias 31. This step is shown in FIG. 20.
7. Deposit and pattern resist using Mask 3. This mask defines the heater.

Figure 21:
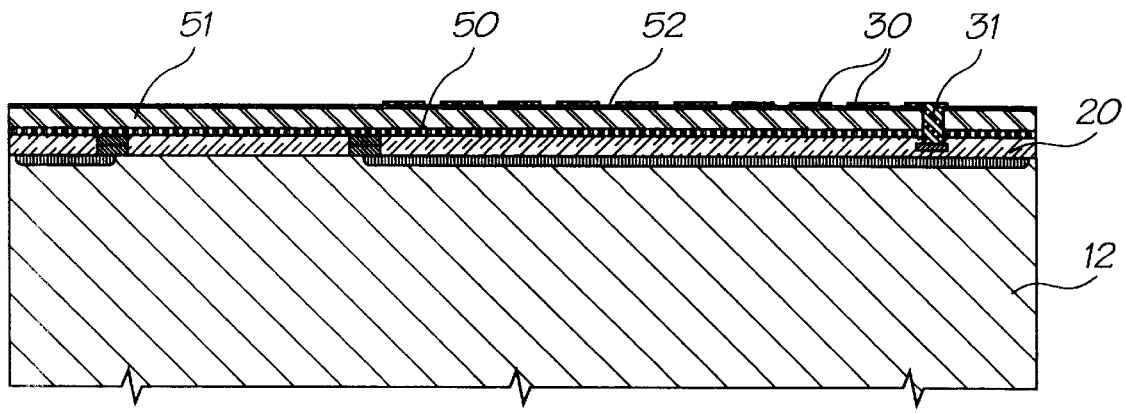
Figure 22:
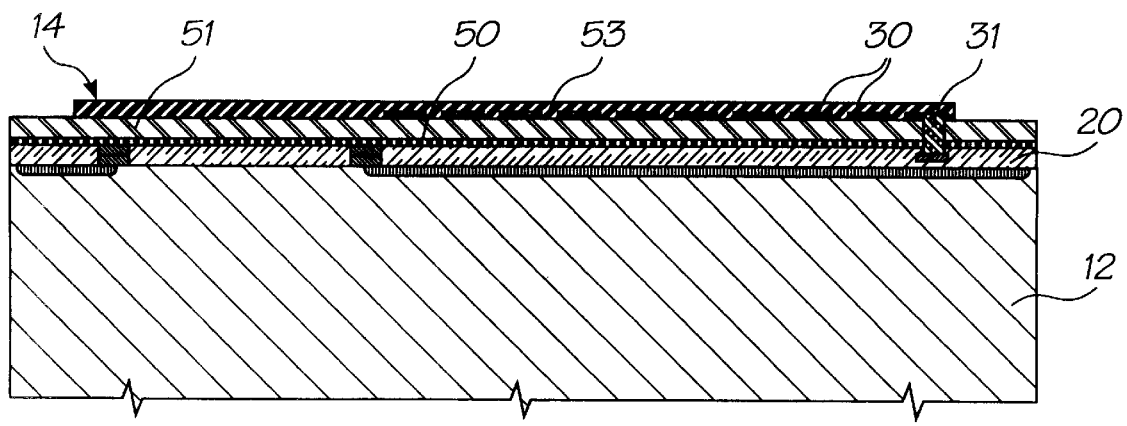
Figure 23:
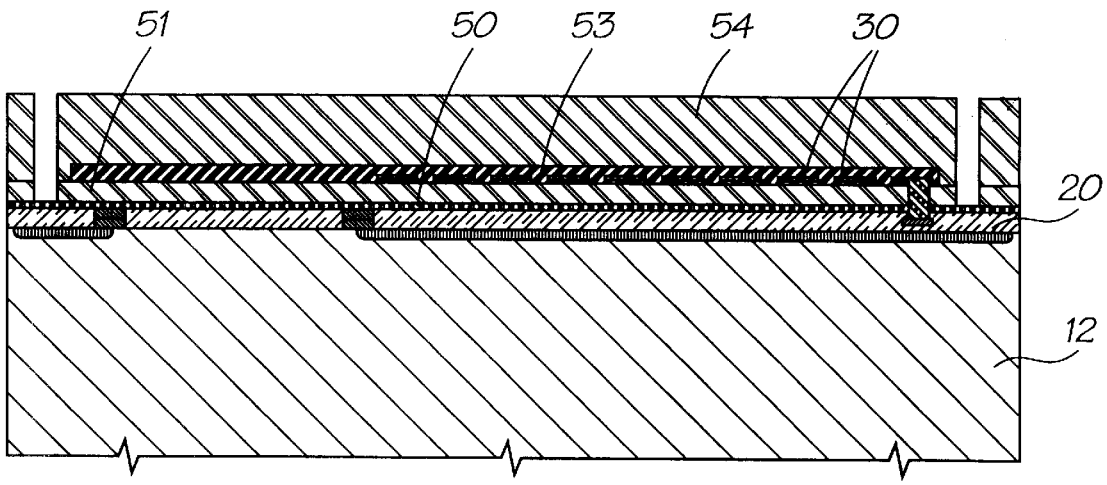
Figure 24:
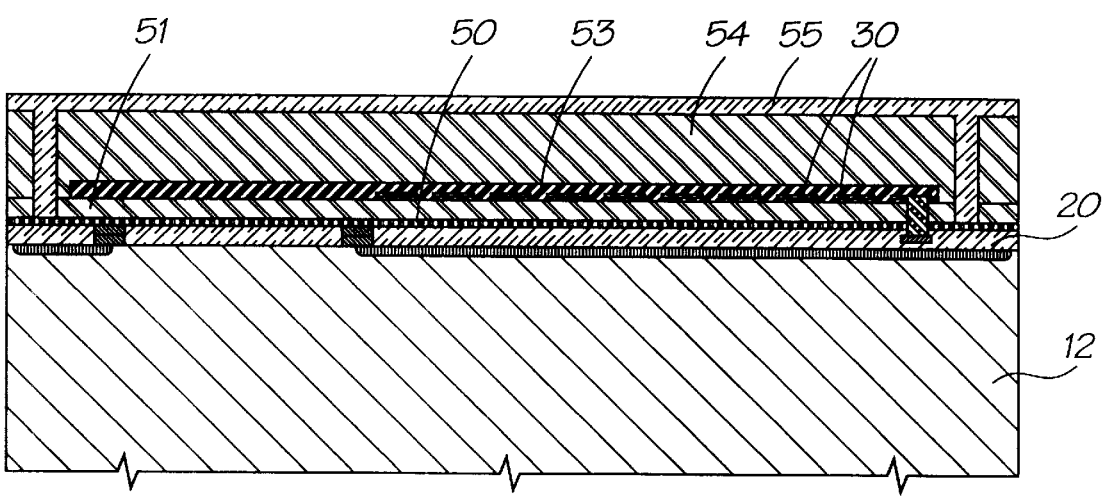
Figure 25:
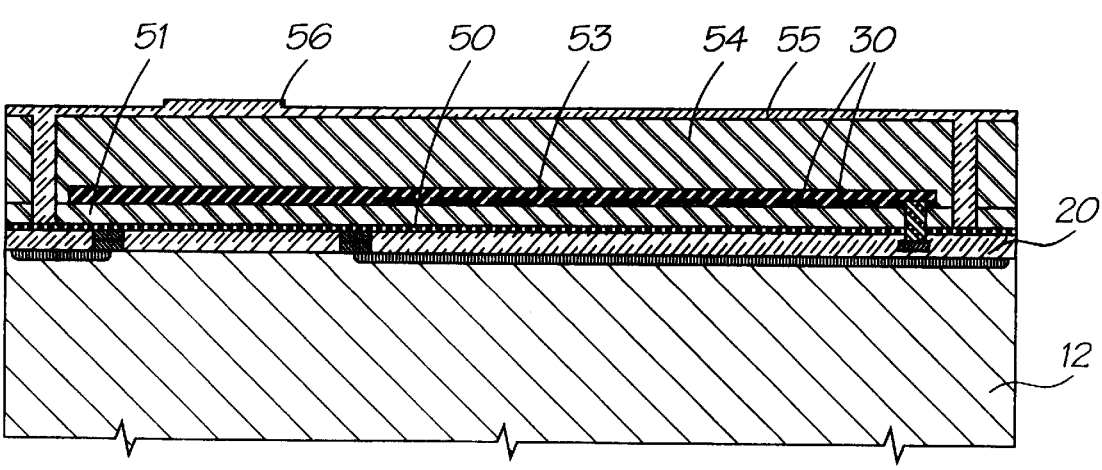
Figure 26:
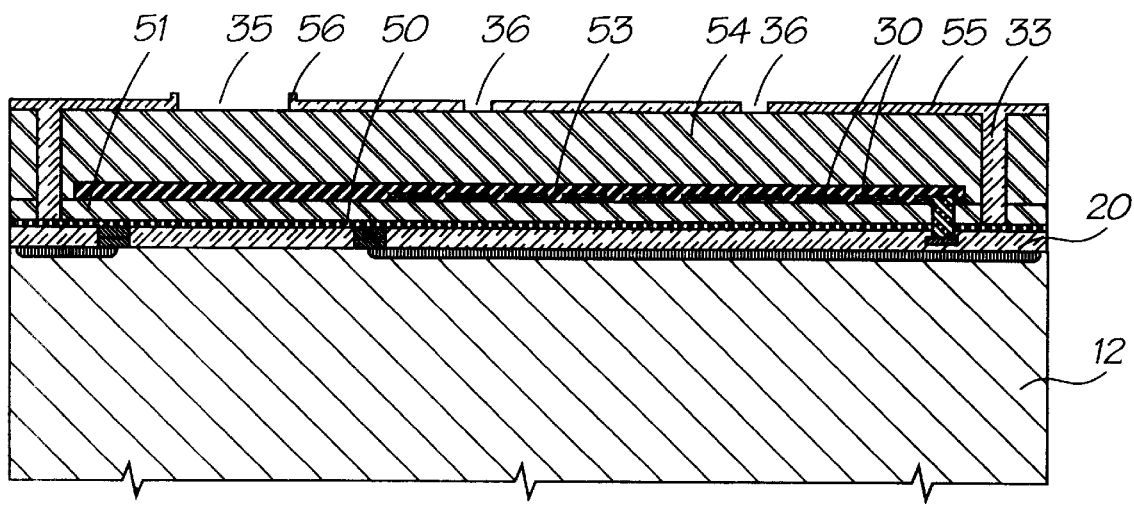
Figure 27:
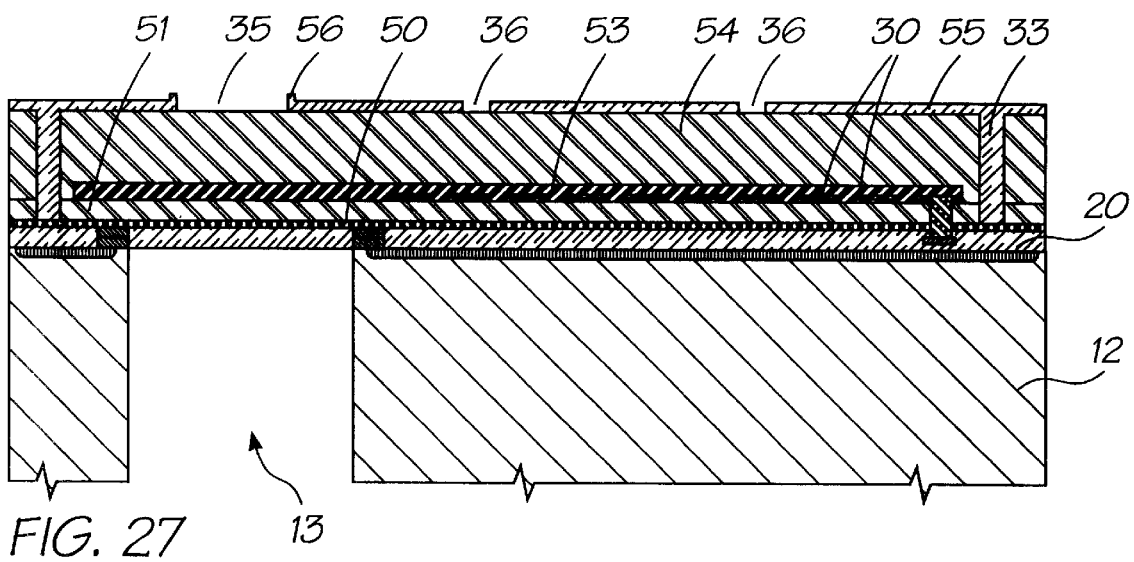
Figure 28:
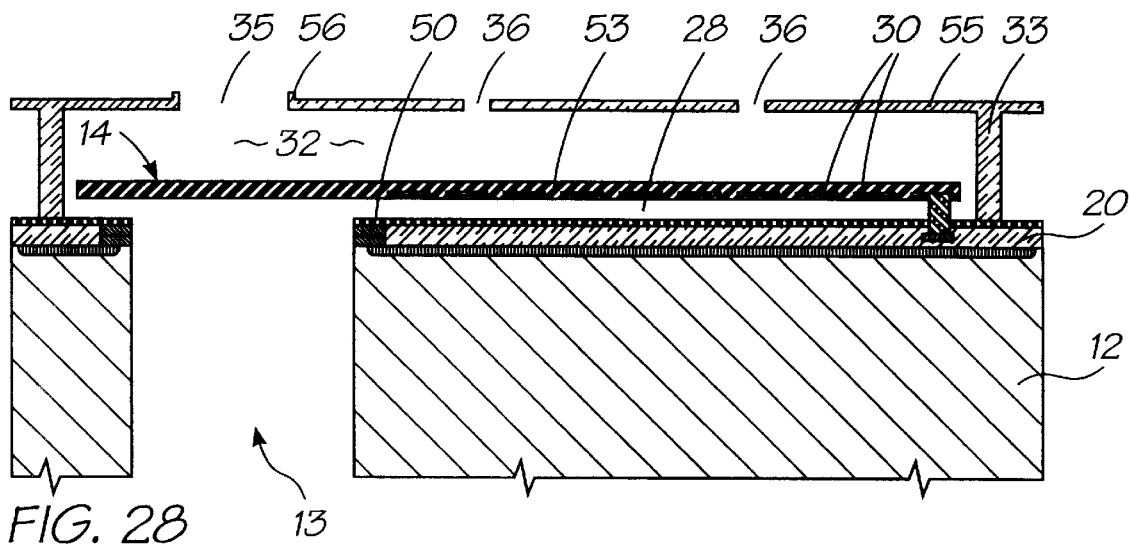
Figure 29:
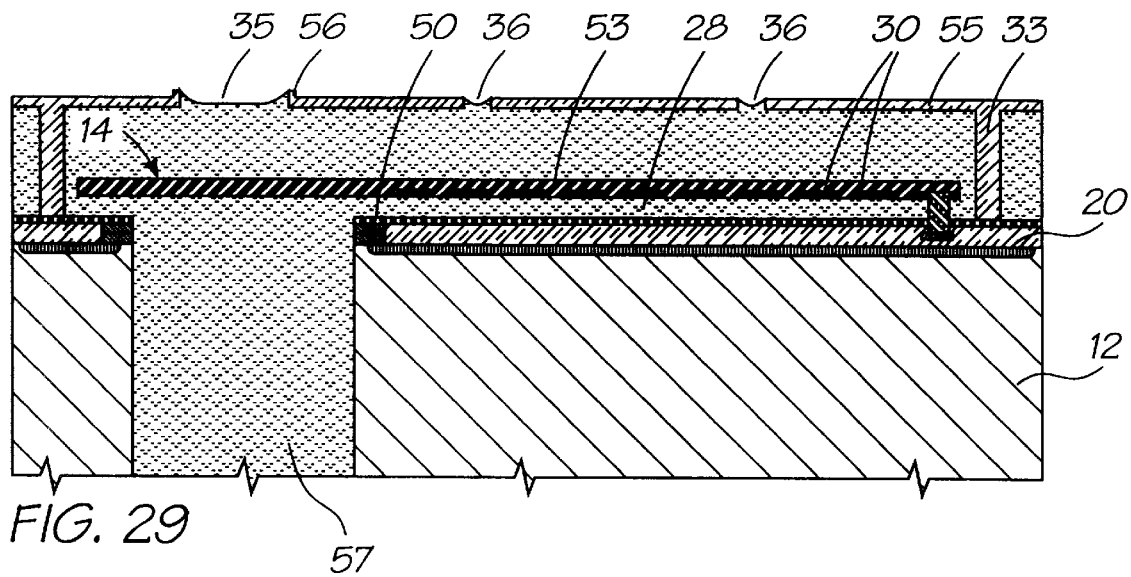

8. Deposit 0.5 microns of gold 30 (or other heater material with a low Young's modulus) and strip the resist. Steps 7 and 8 form a lift-off process. This step is shown in FIG. 21.
9. Deposit 1.5 microns of PTFE 53.
10. Etch the PTFE 53 down to the sacrificial layer 51 using Mask 4. This mask defines the actuator paddle 14 and the bond pads. This step is shown in FIG. 22.
11. Wafer probe. All electrical connections are complete at this point, and the chips are not yet separated.
12. Plasma process the PTFE 53 to make the top and side surfaces of the paddle hydrophilic. This allows the nozzle chamber to fill by capillarity.
13. Deposit 10 microns of sacrificial material 54.
14. Etch the sacrificial material 54 down to nitride 50 using Mask 5. This mask defines the nozzle chamber. This step is shown in FIG. 23.
15. Deposit 3 microns of PECVD glass 55. This step is shown in FIG. 24.
16. Etch to a depth of 1 micron using Mask 6. This mask defines the nozzle rim 56. This step is shown in FIG. 25.
17. Etch down to the sacrificial layer 54 using Mask 7. This mask defines the nozzle 35 and the sacrificial etch access holes 36. This step is shown in FIG. 26.
18. Back-etch completely through the silicon wafer (with, for example, an ASE Advanced Silicon Etcher from Surface Technology Systems) using Mask 8. This mask defines the ink inlets 13 which are etched through the wafer. The wafer is also diced by this etch. This step is shown in FIG. 27.
19. Back-etch the CMOS oxide layers and subsequently deposited nitride layers 50 and sacrificial layer 51 through to PTFE 53 using the back-etched silicon as a mask.
20. Plasma process the PTFE 53 through the back-etched holes to make the bottom surface of the paddle 14 hydrophilic. This allows the nozzle chamber 11 to fill by capillarity, but maintains a hydrophobic surface underneath the actuator portion of the paddle 14. This hydrophobic surface causes an air bubble 28 to be trapped under the paddle 14 when the nozzle chamber 32 is filled with a water based ink. This bubble 28 serves two purposes: to increase the efficiency of the heater by decreasing thermal conduction away from the heated side of the PTFE, and to reduce the negative pressure on the back of the actuator section of the paddle 14.
21. Etch the sacrificial material. The nozzle chambers 32 are cleared, the actuators freed, and the chips are separated by this etch. This step is shown in FIG. 28.
22. Mount the print heads in their packaging, which may be a molded plastic former incorporating ink channels which supply the appropriate color ink 57 to the ink inlets at the back of the wafer.
23. Connect the print heads to their interconnect systems. For a low profile connection with minimum disruption of airflow, TAB may be used. Wire bonding may also be used if the printer is to be operated with sufficient clearance to the paper.
24. Hydrophobize the front surface of the print heads.
25. Fill the completed print heads with ink 57 and test them. A filled nozzle is shown in FIG. 29.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)
high resolution capability (1,600 dpi or more)
photographic quality output
low manufacturing cost
small size (pagewidth times minimum cross section)
high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table above under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.
Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the table under the heading Cross References to Related Applications.

Other ink jet configurations can readily be derived from these forty-five examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| | Description | Advantages | Disadvantages | Examples |
|---|---|---|---|---|
| ACTUATOR MECHANISM (APPLIED ONLY TO SELECTED INK DROPS) | | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print beads are difficult to fabricate | Canon Bubblejet 1979 Endo et al GB patent 2,007,162 Xerox heater-in-pit 1990 Hawkins. et al U.S. Pat. No. 4,899,181 Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator difficult to integrate with electronics High voltage drive transistors required Full pagewidth print heads impractical due to actuator size Requires electrical poling in high field strengths during | Kyser et al U.S. Pat. No. 3,946,398 Zoltan U.S. Pat. No. 3,683,212 1973 Stemme U.S. Pat. No. 3,747,120 Epson Stylus Tektronix IJ04 |

-continued

| | | | | |
|---|---|---|---|---|
| Electro-strictive | An electric field is used to activate electrostriction in relaxor materials such as lead lanthanum zirconate titanate (PLZT) or lead magnesinm niobate (PMN). | Low power consumption Many ink types can be used Low thermal expansion Electric field strength required (approx. 3.5 V/$\mu$m) can be generated without difficulty Does not require electrical poling | manufacture Low maximum strain (approx. 0.01%) Large area required for actuator due to low strain Response speed is marginal (~10 $\mu$s) High voltage drive transistors required Full pagewidth print heads impracticai due to actuator size | Seiko Epson, Usui et all JP 253401/96 IJ04 |
| Ferro-electric | An electric field is used to induce a phase transition hetween the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high Iongitudinal strain High efficiency Electric field strength of around 3 V/$\mu$m can be readily provided | Difficult to integrate with electronics Unusual materials such as PLZSnT are required Actuators require a large area | IJ04 |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required Full pagewidth print heads are not competitive due to actuator size | IJ02, IJ04 |
| Electro-static pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, U.S. Pat. No. 4,799,068 1989 Miura et al, U.S. Pat. No. 4,810,954 Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | Low power consumption Many ink types can he used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasibie Operating temperature limited to the Curie | IJ07, IJ10 |

| | | | temperature (around 540 K.) | |
|---|---|---|---|---|
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required (2.0–2.1 Tis achievable with CoNiFe [1]) | IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long electromigration lifetime and low resistivity Pigmented inks are usually infeasible | IJ06, JJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementaay force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Simple construction No unusual materials required in fabrication Easy extension from single nozzles to pagewidth print heads | Requires supplementary force to effect drop separation Requires special ink viscosity properties High speed is difficult to achieve Requires oscillating ink pressure A high temperature difference (typically | Silverbrook, EP 0771 658 A2 and related patent applications |

-continued

| | | | 80 degrees) is required | |
|---|---|---|---|---|
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bend actuator | An actuator which relies upon differential thermal expansion upon Joule heating is used. | Low power consumption Many ink types can be. used Simple planar fabrication Small chip area required for each actuator Fast operation High efficiency CMOS compatible voltages and currents Standard MEMS processes can be used Easy extension from single nozzles to pagewidth print heads | Efficient aqueous operation requires a thermal insulator on the hot side Corrosion prevention can be difficult Pigmented inks may be infeasible, as pigment particles may jam the bend actuator | IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38 ,IJ39, IJ40, IJ41 |
| High CTE thermo-elastic actuator | A material with a very high coefficient of thermal expansion (CTE) such as. polytetrafluoroethylene (PTFE) is used. As high CTE materials are usually non-conductive, a heater fabricated from a conductive material is incorporated. A 50 $\mu$m long PTFE bend actuator with polysilicon heater and 15 mW power input can provide 180 $\mu$N force and 10 $\mu$m deflection. Actuator motions include: Bend Push Buckle Rotate | High force can be generated Three methods of PTFE deposition are under development: chemical vapor deposition (CVD), spin coating, and evaporation PTFE is a candidate for low dielectric constant insulation in ULSI Very low power consumption Many ink types can be used Simple planar fabrication Small chip area required for each actuator Fast operation High efficiency CMOS compatible voltages and currents Easy extension from single nozzles to pagewidth print heads | Requires special material (e.g. PTFE) Requires a PTFE deposition process, which is not yet standard in ULSI fabs PTFE deposition cannot be followed with high temperature (above 350° C.) processing Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conduct-ive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: Carbon nanotubes | High force can be generated Very low power consumption Many ink types can be used Simple planar fabrication Small chip area required for each actuator Fast operation High efficiency CMOS compatible voltages and currents Easy extension from | Requires special materials development (High CTE conductive polymer) Requires a PThE deposition process, which is not yet standard in ULSI fabs PTFE deposition cannot be followed with high temperature (above 350° C.) processing Evaporation and CVD deposition | IJ24 |

-continued

| | | | | |
|---|---|---|---|---|
| | Metal fibers<br>Conductive polymers<br>such as doped<br>polythiophene<br>Carbon granules | single nozzles to<br>pagewidth print<br>heads | techniques cannot<br>be used<br>Pigmented inks may<br>be infeasible, as<br>pigment particles<br>may jam the bend<br>actuator | |
| Shape<br>memory<br>alloy | A shape memory alloy<br>such as TiNi (also<br>known as Nitinol -<br>Nickel Titanium alloy<br>developed at the Naval<br>Ordnance Laboratory)<br>is thermally switched<br>between its weak<br>martensitic state and<br>its high stiffness<br>austenic state. The<br>shape of the actuator<br>in its martensitic state<br>is deformed relative to<br>the austenic shape.<br>The shape change<br>causes ejection of a<br>drop. | High force is<br>available (stresses<br>of hundreds of MPa)<br>Large strain is<br>available (more than<br>3%)<br>High corrosion<br>resistance<br>Simple construction<br>Easy extension from<br>single nozzles to<br>pagewidth print<br>heads<br>Low voltage<br>operation | Fatigue limits<br>maximum number<br>of cycles<br>Low strain (1%) is<br>required to extend<br>fatigue resistance<br>Cycle rate limited<br>by heat removal<br>Requires unusual<br>materials (TiNi)<br>The latent heat of<br>transformation must<br>be provided<br>High current<br>operation<br>Requires pre-<br>stressing to distort<br>the martensitic state | IJ26 |
| Linear<br>Magnetic<br>Actuator | Linear magnetic<br>actuators include the<br>Linear Induction<br>Actuator (LIA), Linear<br>Permanent Magnet<br>Synchronous Actuator<br>(LPMSA), Linear<br>Reluctance<br>Synchronous Actuator<br>(LRSA), Linear<br>Switched Reluctance<br>Actuator (LSRA), and<br>the Linear Stepper<br>Actuator (LSA).<br>Low voltage<br>operation | Linear Magnetic<br>actuators can be<br>constructed with<br>high thrust, long<br>travel, and high<br>efficiency using<br>planar<br>semiconductor<br>fabrication<br>techniques<br>Long actuator travel<br>is available<br>Medium force is<br>available<br>operation | Requires unusual<br>semiconductor<br>materials such as<br>soft magnetic alloys<br>(e.g. CoNiFe)<br>Some varieties also<br>require permanent<br>magnetic materials<br>such as Neodymium<br>iron boron (NdFeB)<br>Requires complex<br>multi-phase drive<br>circuitry<br>High current | IJ12 |

BASIC OPERATION MODE

| | | | | |
|---|---|---|---|---|
| Actuator<br>directly<br>pushes ink | This is the simplest<br>mode of operation: the<br>actuator directly<br>supplies sufficient<br>kinetic energy to expel<br>the drop. The drop<br>must have a sufficient<br>velocity to overcome<br>the surface tension. | Simple operation<br>No external fields<br>required<br>Satellite drops can<br>be avoided if drop<br>velocity is less than<br>4 mls<br>Can be efficient,<br>depending upon the<br>actuator used | Drop repetition rate<br>is usually limited to<br>around 10 kHz.<br>However, this is not<br>fundamental to the<br>method, but is<br>related to the refill<br>method normally<br>used<br>All of the drop<br>kinetic energy must<br>be provided by the<br>actuator<br>Satellite drops<br>usually form if drop<br>velocity is greater<br>than 4.5 mls | Thermal ink jet<br>Piezoetectri.#c imk jet<br>IJ01, IJ02, IJ03,<br>IJ04, IJ05, IJ06,<br>IJ07, IJ09, IJ11,<br>IJ12, IJ14, IJ16,<br>IJ20, IJ22, IJ23,<br>IJ24, IJ25, IJ26,<br>IJ27, IJ28, IJ29,<br>IJ30, IJ31, IJ32,<br>IJ33, IJ34, IJ35,<br>IJ36, IJ37, IJ38,<br>IJ39, IJ40, IJ41,<br>IJ42, IJ43, IJ44 |
| Proximity | The drops to be<br>printed are selected by<br>some manner (e.g.<br>thermally induced<br>surface tension<br>reduction of<br>pressurized ink).<br>Selected drops are<br>separated from the ink<br>in the nozzle by<br>contact with the print<br>medium or a transfer<br>roller. | Very simple print<br>head fabrication can<br>be used<br>The drop selection<br>means does not need<br>to provide ffie<br>energy required to<br>separate the drop<br>from the nozzle | Requires close<br>proximity between<br>the print head and<br>the print media or<br>transfer roller<br>May require two<br>print heads printing<br>alternate rows of the<br>image<br>Monolithic color<br>print heads are<br>difficult | Silverbrook, EP<br>0771 658 A2 and<br>related patent<br>applications |
| Electro-<br>static pull<br>on ink | The drops to be<br>printed are selected by<br>some manner (e.g.<br>thermally induced<br>surface tension<br>reduction of | Very simple print<br>head fabrication can<br>be used<br>The drop selection<br>means does not need<br>to provide the | Requires very high<br>electrostatic field<br>Electrostatic field<br>for small nozzle<br>sizes is above air<br>breakdown | Silverbrook, EP<br>0771 658 A2 and<br>related patent<br>applications<br>Tone-Jet |

-continued

| | | energy required to separate the drop from the nozzle | Electrostatic field may attract dust | |
|---|---|---|---|---|
| Magnetic pull on ink | The drops to be printed are selected by some manner (e.g. thermally induced surface tension reduction of (pressurized ink). Selected drops are separated from the ink in the nozzle by a strong magnetic field acting on the magnetic ink. | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Reqwres ink pressure modulator Friction and wear must be considered Stiction is possible | IJIJ, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |

AUXILIARY MECHANISM (APPLIED TO ALL NOZZLES)

| | | | | |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. I301, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimul- ation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can proyide a refill pulse, allowing higher operating speed The actuators may operate with much lower energy Acoustic lenses can be used to focus.the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17, IJ18, IJ19, IJ21 |
| Media proximity | The print head is placed in close | Low power High accuracy | Precision assembly required | Silverbrook, EP 0771 658 A2 and |

-continued

| | | | | |
|---|---|---|---|---|
| | proximity to the print medium. Selected drops protrude from the print head further than unselected drops, and contact the print medium. The drop soaks into the medium fast enough to cause drop separation. | Simple print head construction | Paper fibers may cause problems Cannot print on rough substrates | related patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the IJ series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process. | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |

ACTUATOR AMPLIFICATION OR MODIFICATION METHOD

| | Description | Advantages | Disadvantages | Examples |
|---|---|---|---|---|
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | High stresses are involved Care must be taken that the materials do not delaminate Residual bend resulting from high temperature or high stress during formation | Piezoelectric IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient | Very good temperature stability High speed, as a new drop can be fired before heat | High stresses are involved Care must be taken that the materials do not delaminate | IJ40, IJ41 |

-continued

ACTUATOR AMPLIFICATION OR MODIFICATION METHOD

| | Description | Advantages | Disadvantages | Examples |
|---|---|---|---|---|
| | temperature and residual stress. The actuator only responds to transient heating of one side or the other. | dissipates Cancels residual stress of formation | | |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | Simple means of increasing travel of a bend actuator | Care must be taken not to exceed the elastic limit in the flexure area Stress distribution is very uneven Difficult to accurately model with finite element analysis | IJ10, IJ19, IJ33 |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |

ACTUATOR AMPLIFICATION OR MODIFICATION METHOD

| | Description | Advantages | Disadvantages | Examples |
|---|---|---|---|---|
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| | Description | Advantages | Disadvantages | Examples |
|---|---|---|---|---|
| Volume expansion | The volume of the actuator changes, pushing the ink in all directions. | ◆ Simple construction in the case of thermal ink jet | ◆ High energy is typically required to achieve volume expansion. This leads to thermal stress, cavitation, and kogation in thermal ink jet implementations | ◆ Hewlett-Packard Thermal Ink jet ◆ Canon Bubblejet |
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ IJ01, IJ02, 1J04, IJ07, IJ11, IJ14 |
| Parallel to chip surface | The actuator moves parallel to the print head surface. Drop ejection may still be normal to the surface. | ◆ Suitable for planar fabrication | ◆ Fabrication complexity ◆ Friction ◆ Stiction | ◆ IJ12, IJ13, IJ15, IJ33, IJ34, IJ35, IJ36 |
| Membrane push | An actuator with a high force but small | ◆ The effective area of the actuator | ◆ Fabrication complexity | ◆ 1982 Howkins U.S. Pat. No. 4,459,601 |

-continued

ACTUATOR MOTION

| | Description | Advantages | Disadvantages | Examples |
|---|---|---|---|---|
| | area is used to push a stiff membrane that is in contact with the ink. | becomes the membrane area | ◆ Actuator size<br>◆ Difficulty of integration in a VLSI process | |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to equivalent single bend actuators. | ◆ IJ36, IJ37, IJ38 |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck U.S. Pat. No. 4,584,590 |
| Radial constriction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process<br>◆ Small area required, therefore low cost | ◆ Difficult to fabricate for non-planar devices<br>◆ Poor out-of-plane stiffness | ◆ IJ17, IJ21, IJ34, IJ35 |
| Bow | The actuator bows (or buckles) in the middle when energized. | ◆ Can increase the speed of travel<br>◆ Mechanically rigid | ◆ Maximum travel is constrained<br>◆ High force required | ◆ IJ16, IJ18, IJ27 |
| Push-Pull | Two actuators control a shutter. One actuator pulls the shutter, and the other pushes it. | ◆ The structure is pinned at both ends, so has a high out-of-plane rigidity | ◆ Not readily suitable for ink jets which directly push the ink | ◆ IJ18 |
| Curl inwards | A set of actuators curl inwards to reduce the volume of ink that they enclose. | ◆ Good fluid flow to the region behind the actuator increases efficiency | ◆ Design complexity | ◆ IJ20, IJ42 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ IJ43 |
| Iris | Multiple vanes enclose a volume of ink. These | ◆ High efficiency<br>◆ Small chip area | ◆ High fabrication complexity | ◆ IJ22 |

-continued

ACTUATOR MOTION

| | Description | Advantages | Disadvantages | Examples |
|---|---|---|---|---|
| | simultaneously rotate, reducing the volume between the vanes. | | ◆ Not suitable for pigmented inks | |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal ink jet<br>◆ Piezoelectric ink jet<br>◆ IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | ◆ High speed<br>◆ Low actuator energy, as the actuator need only open or close the shutter, instead of ejecting the ink drop | ◆ Requires common ink pressure oscillator<br>◆ May not be suitable for pigmented inks | ◆ IJ08, IJ13, IJ15, IJ17, IJ18, IJ19, IJ21 |
| Refill actuator | After the main actuator has ejected a drop a second (refill) actuator is energized. The refill actuator pushes ink into the nozzle chamber. The refill actuator returns slowly, to prevent its return from emptying the chamber again. | ◆ High speed, as the nozzle is actively refilled | ◆ Requires two independent actuators per nozzle | ◆ IJ09 |
| Positive ink pressure | The ink is held a slight positive pressure. After the ink drop is | ◆ High refill rate, therefore a high drop repetition rate | ◆ Surface spill must be prevented<br>◆ Highly hydrophobic | ◆ Silverbrook, EP 0771 658 A2 and related patent |

-continued

NOZZLE REFILL METHOD

| | Description | Advantages | Disadvantages | Examples |
|---|---|---|---|---|
| | ejected, the nozzle chamber fills quickly as surface tension and ink pressure both operate to refill the nozzle. | is possible | print head surfaces are required | applications<br>♦ Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially | Design simplicity | Restricts refill rate May result in a relatively large chip | IJ02, IJ37, IJ44 |

METHOD OF RESTRICTING BACK-FLOW THROUGH INLET

| | Description | Advantages | Disadvantages | Examples |
|---|---|---|---|---|
| | smaller cross section than that of the nozzle, resulting in easier ink egress out of the nozzle than out of the inlet. | | area Only partially effective | |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | ◆ No added complexity on the print head | ◆ May not be sufficient to displace dried ink | ◆ Most ink jet systems IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink heater | In systems which heat the ink, but do not boil it under normal situations, nozzle clearing can be achieved by over-powering the heater and boiling ink at the nozzle. | ◆ Can be highly effective if the heater is adjacent to the nozzle | ◆ Requires higher drive voltage for clearing ◆ May require larger drive transistors | ◆ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient | ◆ Does not require extra drive circuits on the print head ◆ Can be readily controlled and initiated by digital logic | ◆ Effectiveness depends substantially upon the configuration of the ink jet nozzle | ◆ May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, |

-continued

NOZZLE CLEARING METHOD

| | Description | Advantages | Disadvantages | Examples |
|---|---|---|---|---|
| | vibrations to dislodge clogged nozzles. | | | IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | ◆ A simple solution where applicable | ◆ Not suitable where there is a hard limit to actuator movement | ◆ May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ◆ A high nozzle clearing capability can be achieved<br>◆ May be implemented at very low cost in systems which already include acoustic actuators | ◆ High implementation cost if system does not already include an acoustic actuator | ◆ IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | ◆ Can clear severely clogged nozzles | ◆ Accurate mechanical alignment is required<br>◆ Moving parts are required<br>◆ There is risk of damage to the nozzles<br>◆ Accurate fabrication is required | ◆ Silverbrook, EP 0771 658 A2 and related patent applications |
| Ink pressure pulse | The pressure of the ink is temporarily increased so that ink streams from all of the nozzles. This may be used in conjunction with actuator energizing. | ◆ May be effective where other methods cannot be used | ◆ Requires pressure pump or other pressure actuator<br>◆ Expensive<br>◆ Wasteful of ink | ◆ May be used with all IJ series ink jets |
| Print head wiper | A flexible 'blade' is wiped across the print head surface. The blade is usually fabricated from a flexible polymer, e.g. rubber or synthetic elastomer. | ◆ Effective for planar print head surfaces<br>◆ Low cost | ◆ Difficult to use if print head surface is non-planar or very fragile<br>◆ Requires mechanical parts<br>◆ Blade can wear out in high volume print systems | ◆ Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | ◆ Can be effective where other nozzle clearing methods cannot be used<br>◆ Can be implemented at no additional cost in some ink jet configurations | ◆ Fabrication complexity | ◆ Can be used with many IJ series ink jets |

| NOZZLE PLATE CONSTRUCTION | | | | |
|---|---|---|---|---|
| | Description | Advantages | Disadvantages | Examples |
| Electro-formed nickel | A nozzle plate is separately fabricated from electroformed nickel, and bonded to the print head chip. | ◆ Fabrication simplicity | ◆ High temperatures and pressures are required to bond nozzle plate<br>◆ Minimum thickness constraints<br>◆ Differential thermal expansion | ◆ Hewlett Packard Thermal Ink jet |
| Laser ablated or drilled polymer | Individual nozzle holes are ablated by an intense UV laser in a nozzle plate, which is typically a polymer such as polyimide or polysulphone | ◆ No masks required<br>◆ Can be quite fast<br>◆ Some control over nozzle profile is possible<br>◆ Equipment required is relatively low cost | ◆ Each hole must be individually formed<br>◆ Special equipment required<br>◆ Slow where there are many thousands of nozzles per print head<br>◆ May produce thin burrs at exit holes | ◆ Canon Bubblejet<br>◆ 1988 Sercel et al., SPIE, Vol. 998 Excimer Beam Applications, pp. 76–83<br>◆ 1993 Watanabe et al., U.S. Pat. No. 5,208,604 |
| Silicon micro-machined | A separate nozzle plate is micromachined from single crystal silicon, and bonded to the print head wafer. | ◆ High accuracy is attainable | ◆ Two part construction<br>◆ High cost<br>◆ Requires precision alignment<br>◆ Nozzles may be clogged by adhesive | ◆ K. Bean, IEEE Transactions on Electron Devices, Vol. ED-25, No. 10, 1978, pp 1185–1195<br>◆ Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | ◆ No expensive equipment required<br>◆ Simple to make single nozzles | ◆ Very small nozzle sizes are difficult to form<br>◆ Not suited for mass production | ◆ 1970 Zoltan U.S. Pat. No. 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | ◆ High accuracy (<1 μm)<br>◆ Monolithic<br>◆ Low cost<br>◆ Existing processes can be used | ◆ Requires sacrificial layer under the nozzle plate to form the nozzle chamber<br>◆ Surface may be fragile to the touch | ◆ Silverbrook, EP 0771 658 A2 and related patent applications<br>◆ IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | ◆ High accuracy (<1 μm)<br>◆ Monolithic<br>◆ Low cost<br>◆ No differential expansion | ◆ Requires long etch times<br>◆ Requires a support wafer | ◆ IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | ◆ No nozzles to become clogged | ◆ Difficult to control drop position accurately<br>◆ Crosstalk problems | ◆ Ricoh 1995 Sekiya et al U.S. Pat. No. 5,412,413<br>◆ 1993 Hadimioglu et al EUP 550,192<br>◆ 1993 Elrod et al EUP 572,220 |
| Trough | Each drop ejector has a trough through which a paddle moves. There is no nozzle plate. | ◆ Reduced manufacturing complexity<br>◆ Monolithic | ◆ Drop firing direction is sensitive to wicking. | ◆ IJ35 |
| Nozzle slit instead of | The elimination of nozzle holes and | ◆ No nozzles to become clogged | ◆ Difficult to control drop position | ◆ 1989 Saito et al U.S. Pat. No. 4,799,068 |

-continued

NOZZLE PLATE CONSTRUCTION

| | Description | Advantages | Disadvantages | Examples |
|---|---|---|---|---|
| individual nozzles | replacement by a slit encompassing many actuator positions reduces nozzle clogging, but increases crosstalk due to ink surface waves | | accurately<br>♦ Crosstalk problems | |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | ♦ Simple construction<br>♦ No silicon etching required<br>♦ Good heat sinking via substrate<br>♦ Mechanically strong<br>♦ Ease of chip handing | ♦ Nozzles limited to edge<br>♦ High resolution is difficult<br>♦ Fast color printing requires one print head per color | ♦ Canon Bubblejet 1979 Endo et al GB patent 2,007,162<br>♦ Xerox heater-in-pit 1990 Hawkins et al U.S. Pat. No. 4,899,181<br>♦ Tone-jet |
| Surface ('roof shooter') | Ink flow is along the surface of the chip, and ink drops are ejected from the chip surface, normal to the plane of the chip. | ♦ No bulk silicon etching required<br>♦ Silicon can make an effective heat sink<br>♦ Mechanical strength | ♦ Maximum ink flow is severely restricted | ♦ Hewlett-Packard TIJ 1982 Vaught et al U.S. Pat. No. 4,490,728<br>♦ IJ02, IJ11, IJ12, IJ20, IJ22 |
| Through chip, forward ('up shooter') | Ink flow is through the chip, and ink drops are ejected from the front surface of the chip. | ♦ High ink flow<br>♦ Suitable for pagewidth print heads<br>♦ High nozzle packing density therefore low manufacturing cost | ♦ Requires bulk silicon etching | ♦ Silverbrook, EP 0771 658 A2 and related patent applications<br>♦ IJ04, IJ17, IJ18, IJ24, IJ27–IJ45 |
| Through chip, reverse ('down shooter') | Ink flow is through the chip, and ink drops are ejected from the rear surface of the chip. | ♦ High ink flow<br>♦ Suitable for pagewidth print heads<br>♦ High nozzle packing density therefore low manufacturing cost | ♦ Requires wafer thinning<br>♦ Requires special handling during manufacture | ♦ IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | ♦ Suitable for piezoelectric print heads | ♦ Pagewidth print heads require several thousand connections to drive circuits<br>♦ Cannot be manufactured in standard CMOS fabs<br>♦ Complex assembly required | ♦ Epson Stylus<br>♦ Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. | ♦ Environmentally friendly<br>♦ No odor | ♦ Slow drying<br>♦ Corrosive<br>♦ Bleeds on paper<br>♦ May strikethrough<br>♦ Cockles paper | ♦ Most existing ink jets<br>♦ All IJ series ink jets<br>♦ Silverbrook, EP 0771 658 A2 and |

-continued

INK TYPE

| | Description | Advantages | Disadvantages | Examples |
|---|---|---|---|---|
| Aqueous, pigment | Modern ink dyes have high water-fastness, light fastness Water based ink which typically contains: water, pigment, surfactant, humectant, and biocide. Pigments have an advantage in reduced bleed, wicking and strikethrough. | ◆ Environmentally friendly<br>◆ No odor<br>◆ Reduced bleed<br>◆ Reduced wicking<br>◆ Reduced strikethrough | ◆ Slow drying<br>◆ Corrosive<br>◆ Pigment may clog nozzles<br>◆ Pigment may clog actuator mechanisms<br>◆ Cockles paper | related patent applications<br>◆ IJ02, IJ04, IJ21, IJ26, IJ27, IJ30<br>◆ Silverbrook, EP 0771 658 A2 and related patent applications<br>◆ Piezoelectric ink-jets<br>◆ Thermal ink jets (with significant restrictions) |
| Methyl Ethyl Ketone (MEK) | MEK is a highly volatile solvent used for industrial printing on difficult surfaces such as aluminum cans. | ◆ Very fast drying<br>◆ Prints on various substrates such as metals and plastics | ◆ Odorous<br>◆ Flammable | ◆ All IJ series ink jets |
| Alcohol (ethanol, 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | ◆ All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | ◆ No drying time- ink instantly freezes on the print medium<br>◆ Almost any print medium can be used<br>◆ No paper cockle occurs<br>◆ No wicking occurs<br>◆ No bleed occurs<br>◆ No strikethrough occurs | ◆ High viscosity<br>◆ Printed ink typically has a 'waxy' feel<br>◆ Printed pages may 'block'<br>◆ Ink temperature may be above the curie point of permanent magnets<br>◆ Ink heaters consume power<br>◆ Long warm-up time | ◆ Tektronix hot melt piezoelectric ink jets<br>◆ 1989 Nowak U.S. Pat. No. 4,820,346<br>◆ All IJ series ink jets |
| Oil | Oil based inks are extensively used in offset printing. They have advantages in improved characteristics on paper (especially no wicking or cockle). Oil soluble dies and pigments are required. | ◆ High solubility medium for some dyes<br>◆ Does not cockle paper<br>◆ Does not wick through paper | ◆ High viscosity: this is a significant limitation for use in ink jets, which usually require a low viscosity. Some short chain and multi-branched oils have a sufficiently low viscosity.<br>◆ Slow drying | ◆ All IJ series ink jets |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | All IJ series ink jets |

I claim:

1. A method of manufacturing an ink supply print head which ejects ink via the utilization of thermal actuator devices, the method comprising the steps of:

(a) providing a silicon and circuitry wafer layer including electrical circuitry necessary for the operation of thermal actuator devices on demand;

(b) depositing a first sacrificial layer on top of the silicon and circuitry wafer layer;

(c) forming a series of heater structure layers defining the thermal actuator devices on top of the first sacrificial layer;

(d) depositing a second sacrificial layer on top of the heater structure layers, the second sacrificial layer including etched portions suitable for forming nozzle chambers;

(e) depositing a third sacrificial layer to define nozzle chambers, each nozzle chamber having an ink ejection port positioned above the second sacrificial layer;

(f) back etching the silicon wafer layer to form an ink supply channel in a region underneath a moving end of each thermal actuator; and (g) etching the first and second sacrificial layers in addition to relevant portions of the silicon and circuitry wafer layer, to free the thermal actuator devices.

2. A method as claimed in claim 1 wherein the back etching of the wafer layer includes forming a single ink supply channel that supplies each of a plurality of nozzle chambers.

3. A method as claimed in claim 2, wherein the third sacrificial layer is formed so that the nozzle chambers each have side wall portions and a top wall portion, with the side wall portions dividing the ink supply channel into multiple supply channels.

4. A method as claimed in claim 1 wherein the heater structure layers are formed by the steps of:

(a) depositing a first expansive material layer having a first coefficient of thermal expansion on the first sacrificial layer;

(b) depositing a conductive heater layer on the first expansive material layer; and (c) depositing a second expansive material layer having a second coefficient of thermal expansion on the conductive heater layer, the first coefficient of thermal expansion being greater than the second coefficient of thermal expansion.

5. A method as claimed in claim 4 wherein the conductive heater layer is formed by the steps of:

(a) forming suitable trenches in the first expansive material layer;

(b) depositing a conductive material over substantially the whole of the first expansive material layer;

(c) chemically and mechanically planarizing the conductive material so that the conductive heater layer remains.

6. A method as claimed in claim 5 wherein the conductive heater layer is formed from substantially pure gold.

7. A method as claimed in claim 1 wherein metal conductive lines are incorporated into the wafer layer to form a barrier to protect the wafer layer from unwanted etching by any sacrificial etchant utilized in etching the sacrificial layers.

8. A method as claimed in claim 1 wherein the back etching step is deep silicon trench etching of the wafer layer.

9. A method as claimed in claim 1 wherein the wafer layer is first passivated by depositing a passivation material on the wafer layer.

10. A method as claimed in claim 1 wherein the third sacrificial layer is formed to define a series of small etchant holes used in the etching of the other sacrificial layers.

11. A method as claimed in claim 1 wherein the third sacrificial layer is comprised substantially entirely of Silicon Nitride.

12. A method as claimed in claim 1 wherein the third sacrificial layer is formed to incorporate portions positioned on the heater structure layers to firmly clamp the heater structure layers to lower layers.

13. A method as claimed in claim 1 wherein the wafer layer comprises a double-sided polished CMOS wafer.

14. A method as claimed in claim 1 which includes a further step of separating the wafer layer into separate printhead chips.

* * * * *